United States Patent
Doty

[19]
[11] Patent Number: 6,060,882
[45] Date of Patent: May 9, 2000

[54] LOW-INDUCTANCE TRANSVERSE LITZ FOIL COILS

[75] Inventor: F. David Doty, Columbia, S.C.

[73] Assignee: Doty Scientific, Inc., Columbia, S.C.

[21] Appl. No.: 09/091,987

[22] PCT Filed: Dec. 26, 1996

[86] PCT No.: PCT/US96/20706

§ 371 Date: Jun. 29, 1998

§ 102(e) Date: Jun. 29, 1998

[87] PCT Pub. No.: WO97/26560

PCT Pub. Date: Jul. 24, 1997

Related U.S. Application Data

[60] Provisional application No. 60/009,408, Dec. 29, 1995.

[51] Int. Cl.[7] ........................ G01V 3/00
[52] U.S. Cl. ............. 324/318; 324/319; 324/322; 600/421
[58] Field of Search .............. 324/300–322, 324/318; 600/421

[56] References Cited

U.S. PATENT DOCUMENTS

| | | | |
|---|---|---|---|
| 4,398,149 | 8/1983 | Zens | 324/319 |
| 4,517,516 | 5/1985 | Hill | 324/318 |
| 4,549,136 | 10/1985 | Zens | 324/308 |
| 4,563,648 | 1/1986 | Hill | 324/318 |
| 4,641,098 | 2/1987 | Doty | 324/322 |
| 4,820,987 | 4/1989 | Mens | 324/318 |
| 4,878,022 | 10/1989 | Carlson | 324/318 |
| 5,379,768 | 1/1995 | Smalén | 128/653.5 |
| 5,481,191 | 1/1996 | Rzedzian | 324/318 |

OTHER PUBLICATIONS

Borsboom et al. Low–frequency quadrature mode birdcage resonator' MAGMA (united states) Mar. 1997, 5(1) pp.33–37 ISSN 0968–5243.

Leifer, Mark C. "Theory of the quadrature Eliptic Birdcage Coil" Magnetic Resonance in Medicine MRM vol. 38 pp. 726–732, Apr. 1997.

Li, Shizhe et al. "A Method to Create an Optimum Current Distribution and Homogeneous B1 Field for Elliptical Birdcage Coils" Magnetic Resonance in Medicine MRM vol. 37, pp. 600–608, Mar. 1997.

Vujcic, T. et al., "Transverse Low–Field RF Coils in MRI" Magnetic Resonance in Medicine MRM vol. 36 1997 pp. 111–116, Dec. 1996.

L. Bollinger, M.G. Prammer, and J.S. Leigh, "A Multiple––Frequency Coil with a Highly Uniform $B_1$ Field," *J. Magn. Reson.*, 1988, 81, 162–166.

G.J. Kost, S.E. Anderson, G.B. Matson, and C.B. Conboy, "A Cylindrical–Window NMR Probe with Extended and Tuning Range for Studies of the Developing Heart,"*J. Magn. Reson.*, 1989, 82, 238–252.

G. Isaac, M.D. Schnall, R.E. Lenkinski, and K. Vogele, "A Design for a Double–Tuned Birdcage Coil for Use in an Integrated MRI/MRS Examination,"*J. Magn. Reson.*, 1990, 89, 42–50.

J.R. Fitzsimmons, B.L. Beck, H.R. Brooker, "Double Resonant Quadrature Birdcage," *Magn. Reson. in Med.*, 1993, 30, 107–114.

F.D. Doty, "Probe Design and Construction," *Encyclopedia of NMR*, Wiley Press, 1996.

Primary Examiner—Christine K. Oda
Assistant Examiner—Tiffany A. Fetzner
Attorney, Agent, or Firm—Oppedahl & Larson LLP

[57] ABSTRACT

A family of NMR coils based on Litz foil conductor groups is disclosed. The simplest embodiment is a two-element Litz foil coil. The foils are joined at node (1) and node (2) and are electrically insulated at crossover (3). When the coil is positioned in a plane perpendicular to a uniform magnetic field, the areas (A) defining two flux sub-windows must be equal.

37 Claims, 34 Drawing Sheets

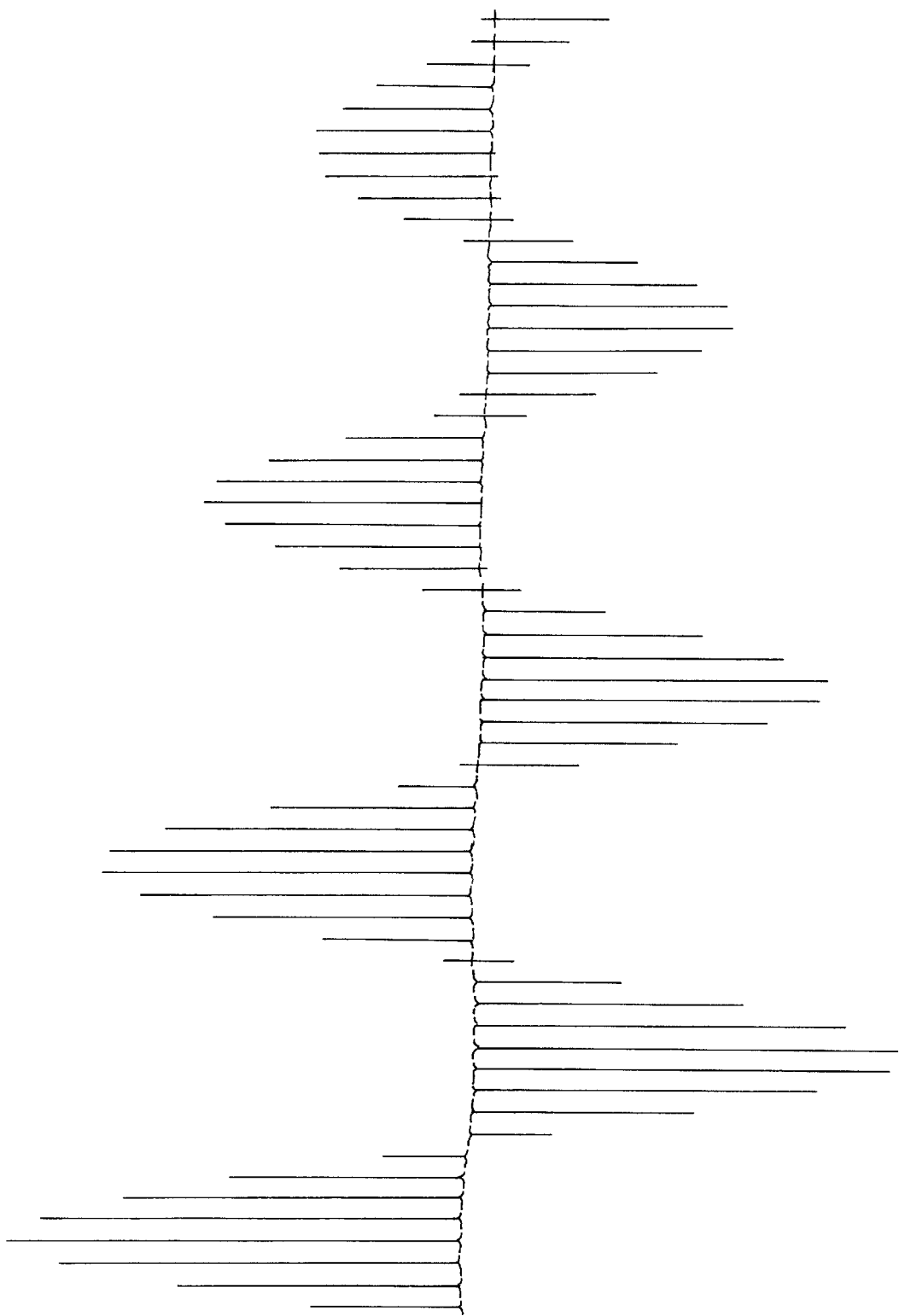

LOW-INDUCTANCE TRANSVERSE LITZ FOIL COILS

This is a national-stage of PCT application no. PCT/US96/20706, filed Dec. 26, 1996, claiming priority from provisional application no. 60/009,408, filed Dec. 29, 1995.

TECHNICAL FIELD

The field of this invention is the measurement of nuclear magnetic resonance (NMR and MRI) for the purpose of determining molecular or microscopic structure, and, more particularly, a tunable, low-inductance, rf coil that has transparency to self-generated rf magnetic fields.

BACKGROUND ART

This invention pertains to improving the sensitivity and $B_1$ homogeneity of NMR and MRI experiments, particularly on large samples at high fields, by means of novel, low-inductance "saddle" or "volume" coils for use on surfaces usually aligned with $B_0$. Related NMR coils are described by Zens in U.S. Pat. No. 4,398,149, Hill and Zens in U.S. Pat. No. 4,517,516, and Doty in U.S. Pat. No. 4,641,098. Sensitivity optimization is reviewed by David Doty in "Probe Design and Construction" in *The NMR Encyclopedia*, Vol. 6, Wiley Press, 1996, and numerous coils are reviewed by James Hyde in "Surface and Other Local Coils for In Vivo Studies", Vol. 7, of the same series. A separate application discloses improved surface coils using litz foil.

The novel coils in this invention have higher quality factor Q, filling factor $\eta_F$, homogeneity of the transverse magnetic field $B_1$, and self-resonance $f_0$. They may also be designed to have sharper roll-off in $B_1$ beyond the region of interest. In high resolution NMR, this gives improved NMR lineshape by reducing sensitivity to sample material located in regions of poor $B_0$ homogeneity, a problem previously addressed by Zens in U.S. Pat. No. 4,549,136 using susceptibility-matched plugs and by Hill in U.S. Pat. No. 4,563,648 using geometric compensation and by many others using shielding (Ad Bax, *J. Magn. Reson.* 65, pp. 142–145, 1985). In MRI, the improved roll-off reduces foldback from signals originating near the gradient null point.

The improvements in this invention are achieved primarily from the use of judiciously chosen, circuitous, parallel, current paths with insulated crossovers that result in (1) greatly reduced current density (typically a factor of three below that of prior-art designs of comparable inductance) along the inner edges of the conductor bands which subtend small angles with respect to the $B_1$ direction, (2) transparency to self-generated $B_1$, and (3) to a lesser extent, improved transparency to orthogonal rf fields. Transparency to self-generated rf fields in low-inductance coils has generally required phase-shift networks, as disclosed by Edelstein et al. in U.S. Pat. No. 4,680,548, but their birdcage design is extremely difficult to tune over a wide range of sample loading conditions or even over the narrowest of multi-nuclear ranges, such as $^{19}F$-$^1H$, a 6% change in frequency. Transparency to self-generated fields can also be achieved by other distributed parameter resonators, as disclosed by Hayes et al., U.S. Pat. No. 4,783,641, and again in U.S. Pat. No. 5,053,711, but these resonators all have severely limited tuning range and inferior $B_1$ homogeneity. Moreover, the ring currents in the birdcage and induced currents in the external rf shield result in poor rf homogeneity ("hot spots" and "dark regions") for large samples.

The NMR spectroscopist often finds it necessary to observe a wide variety of nuclides, especially $^{13}C$, $^1H$, $^{19}F$, $^{27}Al$, $^{29}Si$, $^{23}Na$, $^2H$, and $^{15}N$ in the study of commercially and scientifically important chemicals, and considerable interest is developing in multi-nuclear localized MR spectroscopy. Multi-nuclear tuning is readily achieved in prior art designs with sample diameters up to 15 mm at high field with multi-turn coils having inductance typically in the range of 35 to 150 nH, while fixed-frequency coils may have inductance as low as 2 nH.

Recent improvements by Kost et al. (and proprietary designs by Varian and Nalorac) in the conventional slotted-resonator have improved its homogeneity, but it is still often not adequate for large samples when the ratio of the diameter of the external rf shield to the coil diameter is less than approximately 1.5. Moreover, for coil diameters below 20 mm, its inductance is usually too low for efficient, broadband, multi-nuclear tuning, although it performs reasonably well for fixed frequencies or narrow-band tuning. Because the conventional 2-turn saddle coil has about four times the inductance of the slotted resonator and there have been no good options in-between, one is often faced with the dilemma of not being able to fabricate a coil with optimum inductance for the size and frequency needed.

Phased-array coils, as disclosed first by Carlson in U.S. Pat. No. 4,857,846, consisting of typically four or more separately tuned surface coils, are generally designed for minimal coupling coefficients between adjacent resonators. This offers advantages in localized sensitivity compared to volume coils (though individual surface coils are generally superior in this regard), but at enormous price in tuning complexity and reduced loading flexibility. Nonetheless, phased arrays have become quite popular, possibly because of the lack of highly flexible, multi-purpose local coils. In practice, surface coils are always made and elaborately packaged for specific applications such as shoulder, rear neck, front neck, face, breast, lumbar, etc. The instant invention permits the development of tunable wrap-around coils that are likely to replace surface coils in many applications.

Carlson has also shown in U.S. Pat. No. 4,878,022 that reducing the current concentrations at the edges of coils results in reduced losses in both the sample and the coil.

Isaac et al. and Fitzsimmons et al. have devised complex methods of double-tuning the birdcage, but satisfactory commercial products are generally not available. Bolinger et al. have attempted to improve $B_1$ homogeneity in large single-turn and half-turn tunable structures that resemble the birdcage without phase shifting networks by adjusting the spacing of parallel wires, but they fail to fully consider self-induced currents, ring currents, and shield currents; and their design suffers from poor filling factor and poor $B_1$ homogeneity near the conductor elements. Most of the inventive embodiments illustrated herein may be easily double and triple tuned by conventional methods, similar to those, for example, of Doty in U.S. Pat. No. 5,424,625.

One of the most recently introduced fast MRI techniques, Pi-Echo-Planar-Imaging (PEPI, P. Mansfield), promises substantial improvements in resolution by virtually eliminating the susceptibility artifacts that plagued prior multi-scan EPI techniques, but it places extremely stringent demands on $B_1$ homogeneity. The instant invention achieves order-of-magnitude improvement in $B_1$ homogeneity for large samples when compared to the 8-rung birdcage with a shield-to-coil diameter ratio of 1.2, and it even compares favorably with the unshielded 24-rung birdcage with perfect (impossible) tuning.

The linearly polarized embodiments of the instant invention provide substantially higher homogeneity than any previous low inductance transverse coil design, simple tuneup, high sensitivity, and excellent line shape. Since they do not have well-defined degenerate modes, they are not inherently quadrature coils, but their rf transparency allows two such coils to be aligned orthogonally at slightly differing radii and easily tuned to the same frequency for quadrature operation. However, linearly polarized coils generally have comparable S/N and numerous advantages for low frequency-diameter products. For example, they greatly simplify the use of separate coils for transmit-receive or double resonance. Circularly polarized embodiments are also disclosed, but they are usually less satisfactory than the combination of two linearly polarized coils.

The above-referenced prior art is generally directed at applications in which the coilform is a cylinder aligned with the external magnetic field. Those cases where the sample axis is not aligned with the external magnetic field have generally utilized solenoidal rf coils. However, saddle coils have occasionally been used for the Dynamic Angle Spinning (DAS) line narrowing technique for quadrupolar nuclides in solids and related experimental techniques for dipolar nuclides, in which a solid sample is spun rapidly at a sequence of two or more angles ranging from 0° to 90°. The conventional saddle coil has the advantage that even though its efficiency is less than that of the solenoid for coil orientation angles greater than roughly 35°(which includes the popular "magic angle" of 54.7° and the popular "wideline" angle of 90°), its efficiency is constant with angle while the efficiency of the solenoid approaches zero at 0°. The advantages of the instant invention will reduce the range of applications where the solenoid is chosen for coils not aligned with the external magnetic field.

Litz (woven) wire, comprising multiple strands of insulated wire woven together, has long been used in rf coils to achieve higher Q, as it allows the current to distribute more uniformly over more surface area, especially in regions of high field gradient. Similar principles may be applied to NMR coils by using "woven" or "litz" foil, as space constraints generally favor the use of thin foil in NMR or MRI. Vujcic et al. disclose the use of litz wire for enhanced Q in high-inductance multi-turn birdcage-like resonators for low frequencies in *Magn. Reson. in Med.*, Vol. 36, 1996, pp. 111–116. However, they do not consider deliberate spacings of the insulated strands to improve $B_1$ homogeneity, Q, filling factor, flux transparency, or tunability. Flux through their litz wire is estimated to be approximately 1% of the total rf flux. Parallel helical wires without insulated crossovers have been used commercially by the assignee in solenoidal coils for enhanced Q and flux transparency, and solenoidal litz coils have been used elsewhere.

Even more dramatic than the Q advantage is the $B_1$ homogeneity advantage that is possible because of the transparency to rf fields that arises from properly interleaved foils made by a combination of folds, twists, and jumpers. There is also typically a 20% to 40% improvement in filling factor, partially because a high-homogeneity coil may be positioned closer to the sample, and partially because the field concentrations near the wires are dramatically reduced. In applications where sample losses dominate, conventional guidelines say that filling factor is insignificant. However, both the improved filling factor and the improved $B_1$ homogeneity contribute to reduced sample losses, especially by reducing induced current density in the vicinity of the conductors.

The various embodiments disclosed herein and in copending applications are applicable to perhaps 90% of all NMR and MRI volume coil applications and many surface coil applications, including (a) 3 mm to 15 mm $^1$H and multinuclear NMR high-resolution spectroscopy at 4 T to 30 T, (b) 2 mm to 60 mm $^1$H and multinuclear MR microscopy at 2 T to 12 T, (c) head and whole-body MRI at least up to 3 T, (d) MRI wrap-around (torso) resonators at least up to 7 T, and (e) most surface coils. The result is better performance in broadband tunable coils than was previously possible in fixed-frequency coils.

DISCLOSURE OF INVENTION

A family of NMR coils based on litz foil conductor groups is disclosed, where a litz foil conductor group comprises multiple, parallel, foil conductors with interwoven sub-routes from a first node to a second node and insulated crossovers forming well-defined flux sub-windows.

A series-parallel semi-coil of litz super-groups, litz foil conductor groups and simple conductor elements forms n current turns on one side of the surface of the sample, where n is a small integer and a turn is defined as a 360° path around a transverse axis, the y-axis for example. A litz super-group comprises a series combination of litz foil groups and other inductor elements.

The various conductor elements result in multiple axial and azimuthal current routes in each quadrant of the surface such that each contribute to $B_1$ magnetic field along the $B_1$-axis and leave a central flux window centered on the $B_1$ axis. A substantially identical semi-coil is formed on the opposite side of the sample around the $-B_1$ axis to complete the coil.

The axial boundaries of the central flux window subtend an azimuthal angle less than 85°. The maximum azimuthal angle subtended by the outermost axial current routes is greater than 160°. The axial length of the window may vary from less than half the cylinder radius to eight times the cylinder radius, depending on the sample geometry.

The two semi-coils are electrically connected in parallel and tuned by inserting segmenting capacitors at one or more nodes on each side of the sample. Internal cylindrical rf shields may be positioned at each end of the coil such that the outermost conductor arc at each axial end is fully shielded from the sample. Additional shield arcs are positioned inside the coil under nodes that are segmented with tuning capacitors. The complete, tuned network is positioned inside a concentric cylindrical rf shield.

Except in cases with special symmetries, the sub-routes in each litz foil group are such that when the tuned network is driven at the resonant frequency, the magnetic flux linking one sub-route is approximately the same as that linking any other sub-route in that group. Likewise, the total flux linking all members of a first super-group is approximately equal to the total flux linking all members of any second super-group connected in parallel with the first super-group. Moreover, the various conductors are positioned so as to achieve high $B_1$ homogeneity, filling factor, and Q with relative currents that satisfy Maxwell's equations, as determined by numerical modeling methods.

Often, the conductor pattern would be formed by conventional circuit etching methods on double-clad flexible substrate with foil feedthroughs. Where magnetism is particularly critical, the various foil conductors are fabricated from a zero-susceptibility sandwich foil with ultra-sonically welded nodes and crossovers that may be insulated using long, uniform dielectric strips.

BRIEF DESCRIPTION OF DRAWINGS

The invention will be described with respect to a drawing in several figures, of which:

FIGS. 1, 1A and 1B illustrate several examples of 2-element litz conductor groups;

FIG. 13 is an NMR pulse-width array demonstrating high $B_1$ homogeneity in an EHTT (etched-half-turn-tunable) coil;

BEST MODE FOR CARRYING OUT THE INVENTION

Phased-array coils are generally designed for minimal coupling coefficients. The unexpected result of maximizing the coupling coefficients of parallel conductors is that it is possible to make extremely low inductance geometries behave magnetically more like multi-turn high-inductance coils and thereby achieve vastly improved tunability and $B_1$ homogeneity, and hence, improved filling factor and reduced sample losses.

The blossoming of finite element electromagnetic modeling software makes it possible to design coils in which the desired magnetic field profile is achieved by virtue of the coupling coefficients and phase shifts that arise solely from the coil geometry and interwinding capacitance rather than from the addition of capacitive phase shifting networks. As the frequency-diameter product increases, it is still necessary to insert multiple segmenting capacitors to reduce the effects of stray capacitance and dielectric losses in the sample, but this can usually be done in ways that do not significantly effect $B_1$ homogeneity as a function of frequency. Hence, the coil continues to behave magnetically much like a multi-turn high-inductance coil (approximately equal currents in the various elements and flux transparency), but electrically it looks like an ultra-low inductance coil. Conventional litz (woven) wire has some flux transparency, but the space constraints of the NMR or MRI coil favor the use of woven foil.

Figure 1A:
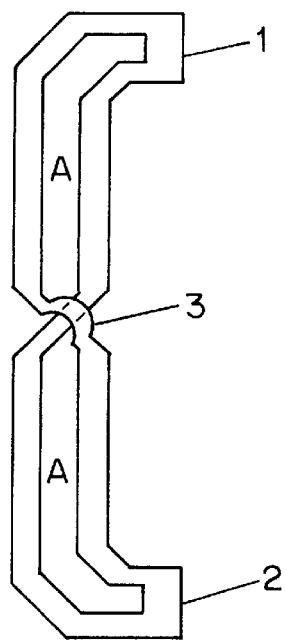
Figure 1B:
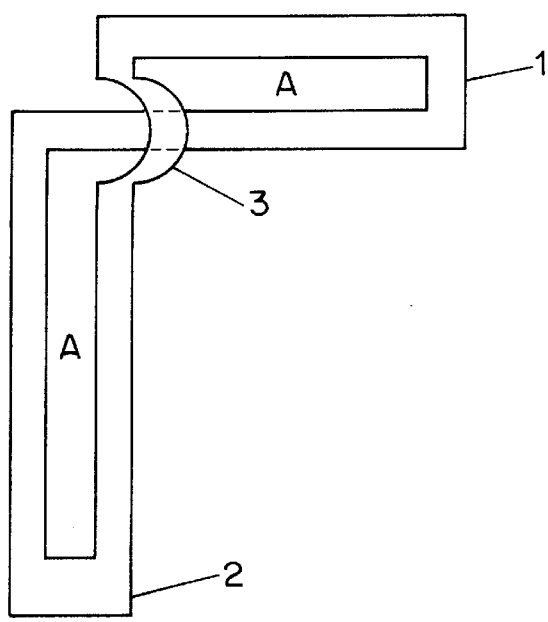

FIGS. 1A and 1B illustrate two simple, 2-element litz foil conductor groups. The foils are joined at node 1 and node 2 and electrically insulated at crossover 3. If, for example, they are positioned in a uniform $B_1$ perpendicular to the plane of the paper, the areas A of the two flux sub-windows in each litz group must be equal (equal flux) for the groups to be transparent to a uniform rf magnetic field—that is, to have no net current induced in the litz loops, although minor eddy currents will be induced within the foils. The litz group then functions as a transparent conductor from node 1 to node 2. Note that this is substantially different from the use of conventional litz wire in conventional rf coils to improve Q by achieving a more uniform current distribution over the surface of the conductors. Conventional, tightly woven litz wire has only limited flux transparency and does not produce the well-defined sub-windows required for optimized current distribution with very few turns over a large surface. Also, note that a litz group by definition does not include a capacitor with significant rf reactance.

The litz groups herein are all illustrated as overlapping, paralleled conductor foils, as only their broadband rf properties and possibly magnetic properties are considered in the optimization of the various patterns. However, audio-blocking capacitors may be inserted into any of the individual conductors within a litz group and have no significant effect on the rf performance where an audio-blocking capacitor is one with magnitude of reactance $X_C$ that is very small compared to the reactance $X_L$ of the self inductance of the litz group at the lowest rf frequency of interest, but large compared to $X_L$ at the highest gradient switching frequency. Since the rf frequencies are typically four or more orders of magnitude larger than the gradient frequencies, this is an easy condition to achieve. Inserting audio-blocking capacitors into each litz group reduces gradient eddy currents, which may be significant if the conductor foils are not very thin, as the litz groups are transparent to uniform fields but not to gradient fields. Audio-blocking capacitors may also be used where $X_C$ is not very small compared to $X_L$ at the lowest rf frequency if $X_C$ is properly considered in the optimization, but the broadband characteristics of the litz group are then lost. However, symmetric use of relatively small blocking capacitors may be advantageous in some fixed-frequency applications. As Xc approaches $X_L$ at the rf frequency, the function of the capacitor changes from audio blocking to rf segmentation, and tuning becomes more difficult and the distinction from prior art array coils becomes more complicated.

Figure 2:
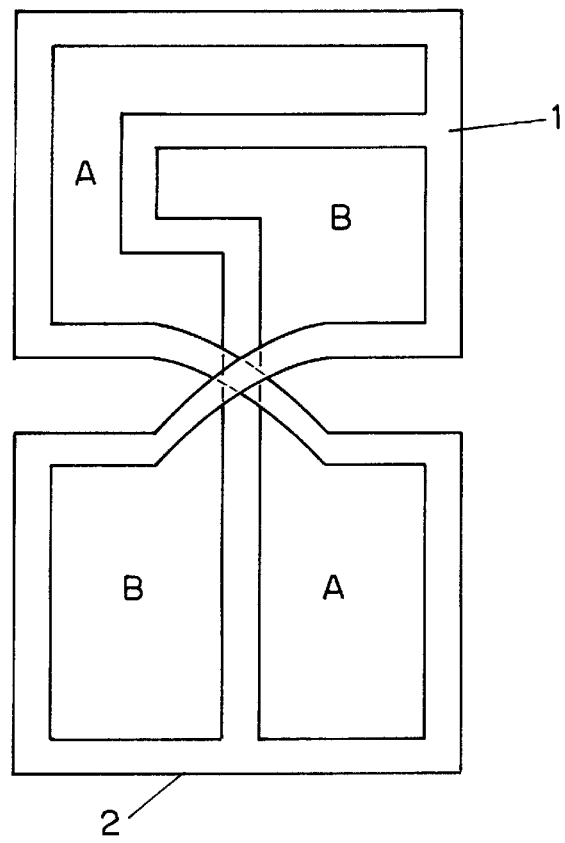
FIG. 2 depicts a 3-element litz conductor group.

FIG. 2 illustrates a 3-element litz group with nodes 1 and 2. Again, when the component of $B_1$ perpendicular to the plane of the paper is uniform, the areas of the two sub-windows labeled A must be equal and the areas of the two sub-windows labeled B must be equal. In actual practice, the litz groups will normally be in regions of non-uniform transverse components (by perhaps 5 to 30%) of $B_1$ and minor adjustments in the areas may be beneficial so that the differential current induced in the litz loops is small compared to the common mode current. However, the areas of the sub-windows should usually be kept nearly equal to simplify design for quadrature operation. An exception exists when each sub-window of a litz group has equal area on each side of the symmetry plane that includes the $B_1$ axis. In this case, the litz group will be transparent to orthogonal fields regardless of the area ratio between the separate sub-windows, although the area ratios will usually be less than 3. This principal is important, for example, in the butterfly coils of FIGS. 15 and 16.

Figure 3A:
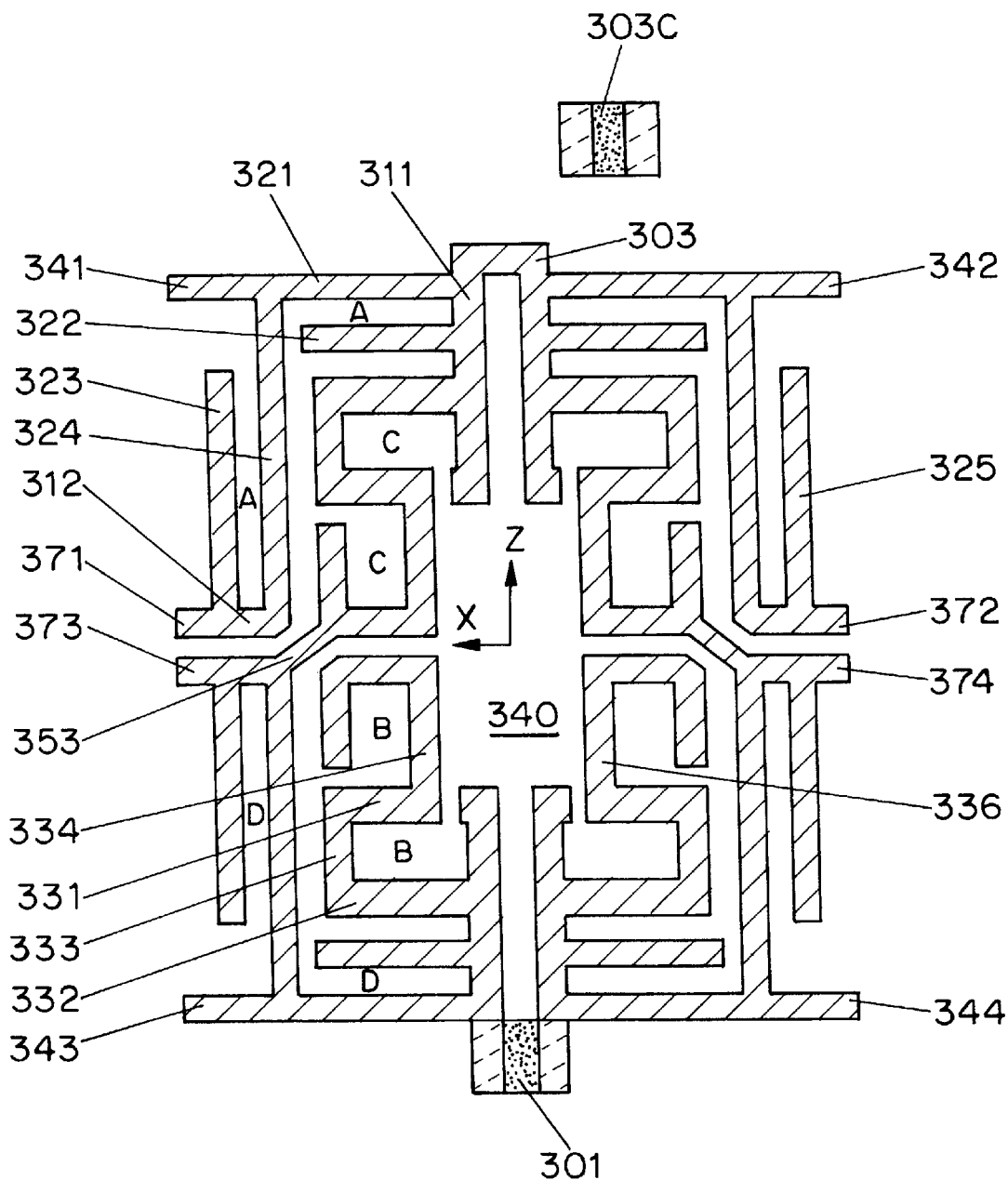
FIGS. 3a, 3b, and 3c respectively illustrate foil patterns on the outside, inside, and both sides superimposed of a typical double-clad laminate for an etched-1-turn-imaging (E1TI) litz coil.
Figure 3B:
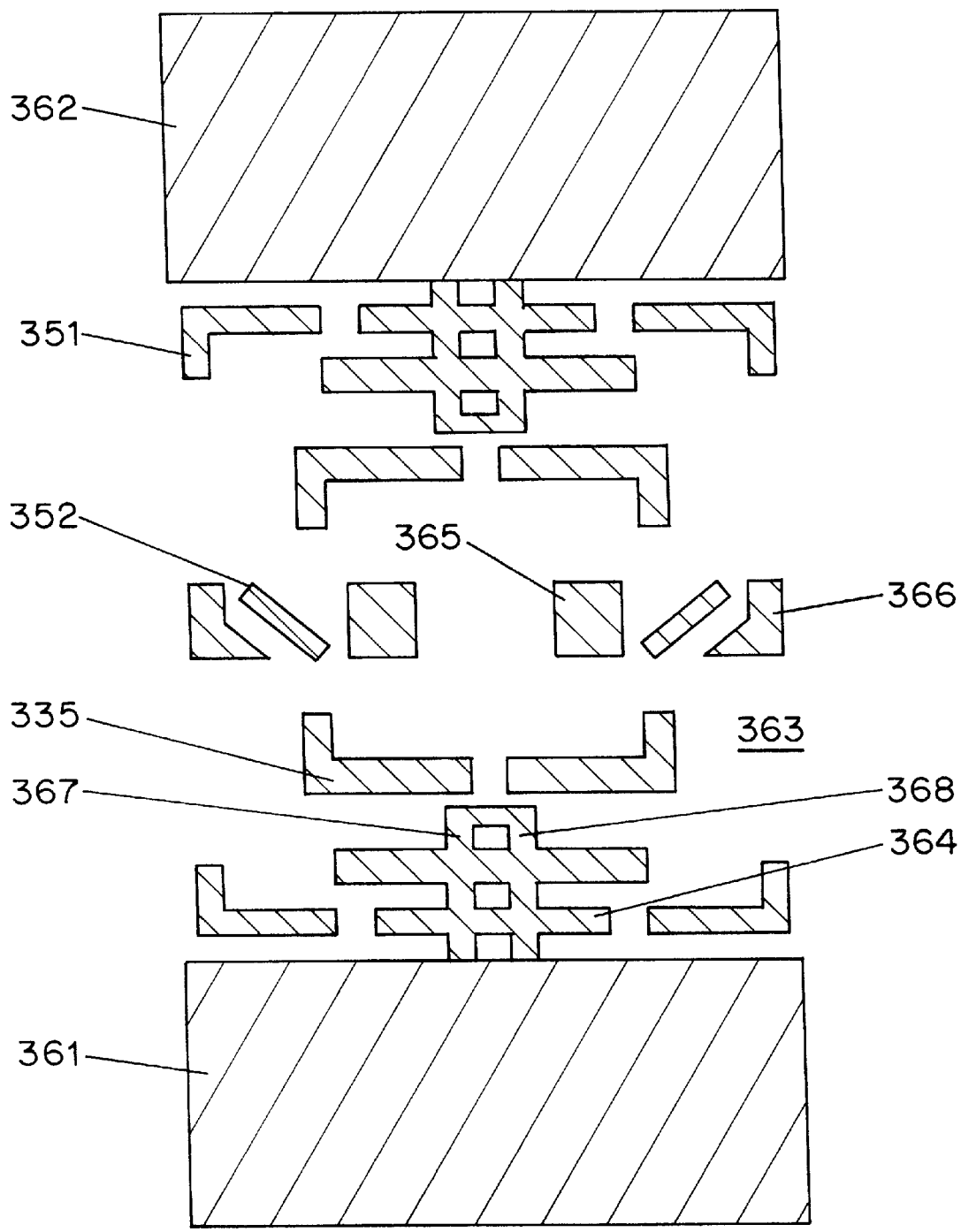
Figure 3C:
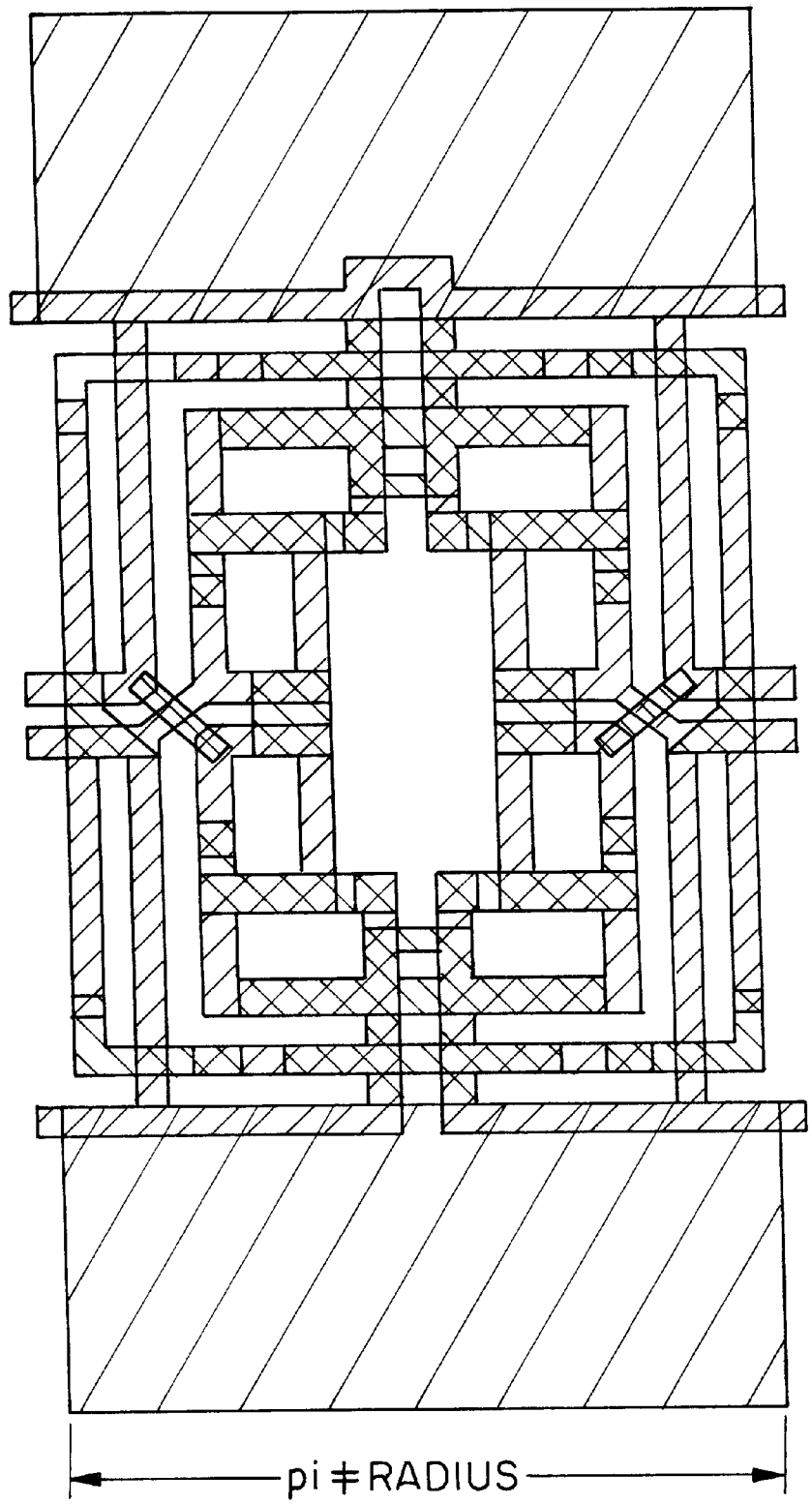

FIG. 3a illustrates one half of the outside of a typical double-sided etched foil pattern for a litz coil intended to be wrapped around an elliptical coilform of mean radius r, usually aligned with the $B_z$ axis. The crossovers are on the inside foil, as shown in FIG. 3b, and their registration is depicted in FIG. 3c, where the outside is shown in diagonal hatch and the inside is shown in a combination of square and slant hatch.

The coil, crossovers, and perhaps portions of a Faraday shield are etched onto a double-clad low-loss dielectric such as copper-clad fiber-glass-reinforced PTFE (teflon). In cases where $^{19}F$ background signals are of more concern than wideline $^1H$ background signals, the preferred substrate would be a polyimide, or perhaps a polyimide honeycomb or ribbed structure.

The following discussions are generally directed at cylindrical samples and cylindrical coilforms aligned with $B_0$, but the samples and coilforms may also be oval or rectangular and need not be aligned with $B_0$. The optimization approach is the same for any approximately elliptical shape, but the optimum angles will differ somewhat. The coilform may also be a flexible laminate sleeve that is allowed to conform to various sample shapes such as the human torso. Obviously, in this case, the performance will be better for some shapes and sizes than for others, but its ease of tuning makes it far better suited for this application than alternative designs.

MRI COILS.

The semi-coil of FIGS. 3a, 3b, 3c, with tuning capacitor 301 and foil short 303 will be denoted an etched-1-turn-imaging (E1TI) litz coil to distinguish it from etched-1-turn spectroscopy coils presented later. Insulated crossover 351 completes one of the current paths from node 311 to node 312 in litz group A comprising azimuthal members 321, 322 and outer axial members 323, 324. Crossover 352 connects litz group A to litz group B, which comprises azimuthal members 331, 332, inner axial members 333, 334, and crossover 335. Litz group A, crossover 352, and litz group B form a first litz super-group on one side of central flux window 340, centered, for example, on the +y axis. Note that since litz group A is essentially one quarter of a large-diameter loop around the $B_1$ (or y, for example) axis and litz group B is essentially one quarter of a small-diameter loop, litz group A will have higher self inductance than litz group B. However, a second litz super-group, equivalent to the first reflected through the z=0 plane, comprising litz groups C and D and crossover 353, which lies directly over (or under) crossover 352, would have the same total inductance as the first super-group. Hence, when paralleled, the current through crossover 352 will be the same as the current through crossover 353, which is equivalent to saying that these two paralleled litz super-groups have the same total flux linkage.

Herein lies the major reason for the advantage of the low-inductance (one-turn) litz coil: the high inductance of a portion of the outer loops is placed in series with the low inductance of a portion of the inner loops to limit current density along the inner edge of the central flux window and achieve transparency of the windings. This means that only a relatively small fraction (typically 25% to 50%) of the total flux through the sample flows through the central flux window, making it possible to maintain uniform flux density throughout a much larger sample.

The above quadrant pattern on the +x ($\theta<90°$) side of the central flux window is then repeated on the -x ($\theta>90°$) side of the central flux window to complete the +y litz semi-coil shown in FIG. 3a.

A second identical semi-coil is centered on the -y axis on the opposite side of the cylinder, and the two are connected in parallel by tabs 341, 342, 343, 344 to complete the E1TI litz coil. When the coil must be transparent to orthogonal rf fields, as for quadrature operation or double resonance, as discussed later, the tabs at one end, 341, 342 for example, must be omitted, or all tabs may be omitted and the two semi-coils may be paralleled by remote connections between the leads. Series connections at the leads are also possible for applications with smaller samples or lower frequencies, but such applications are better addressed by the multi-turn coils discussed later. When both semi-coils are tuned very close to the desired resonance frequency by capacitor 301 and its symmetric counterpart, firm parallel connections between the semi-coils may sometimes be omitted, as the inductive coupling may be sufficient for negligible mode splitting.

Central paralleling tabs 371, 372, 373, 374 may also be used. While the potential difference between tabs 371 and 373 is less than that between tabs 341 and 343, it is still usually sufficient to suppress undesired modes. Connecting central paralleling tabs 371, 372, 373, 374 does not significantly affect transparency to orthogonal rf fields and hence is often the preferred arrangement, especially with center-feed paralleling, as disclosed in a co-pending application.

The optimum locations of the various azimuthal and axial conductor elements will vary depending primarily on the ratio of the sample length to its diameter and to a lesser extend on the ratio of the diameter of the external rf shield to the coil diameter $d_c$. Primary optimization criteria include maximizing filling factor, Q, and central $B_1$ homogeneity, while minimizing rf fields beyond the ends of the homogeneous region. There is also often the requirement of maintaining transparency to orthogonal fields, which requires lower surface coverage by the outer loops.

While the optimum azimuthal subtended angle of the window in the prior art slotted resonator is generally 90°, the optimum azimuthal subtended angle of the central flux window in the litz coil, defined by axial conductor elements 334, 336, is substantially less—typically increasing from 50° to 58° as the shield diameter increases from 1.15 to 2 $d_c$. The optimum subtended angle of the outer edges of outer axial conductor elements 323, 325 is 180° when an orthogonal coil for quadrature detection or double resonance is not present. When an orthogonal coil is present, this outer subtended angle may be reduced to 160° with acceptable loss in $B_1$ homogeneity for most purposes, but 174° is generally preferred. Optimum central window length is typically 60% to 95% of the sample length, compared to 105% for the slotted resonator. Optimum spacing between the outer two axial elements 323, 324 is a little more than half that between the inner two axial elements 333, 334. The requirement of comparable areas in the sub-windows of each litz group then places relatively tight constraints on the relative locations of the azimuthal members 321, 322, 331, 332. The optimization of the E1TI coil (and related coils EHTT and EQTI described shortly) is particularly effective for sample lengths comparable to the coil diameter.

While the current in the inner loop has been effectively limited to approximately one-fourth of the total current per quadrant in this case, that current is still highly concentrated along the edge of the central flux window. Hence, where radial space and manufacturability permit, it is desirable to make this foil edge thick to improve Q in small coils where sample losses are not dominant. One method of doing this is to fold the inner foil edges (the edges closer to the $B_1$ axis) radially outward. Also, moving this edge further from the sample by making the coilform slightly elliptical, with the major axis along the y-axis in this example, will give improved $B_1$ homogeneity. An eccentricity of 1.03 is generally optimum where practical.

It is desirable to shield the sample from the electric field, which is greatest near the capacitor 301. If the coil is electrically balanced, substantial shielding may be easily accomplished with internal cylindrical end rf shields 361, 362, which have the added beneficial effects of improving filling factor by reducing axial rf magnetic field near the outermost conductor arcs, improving central $B_1$ homogeneity, and increasing the rate of rolloff in $B_1$ beyond the ends of the sample. It is for these secondary reasons (and to balance low-order gradient eddies) that shield 362 is included in the E1TI coil, as electric fields are negligible at the end opposite the tuning capacitor 301. Where axial space is severely limited, the internal rf shields, 361, 362 may be shortened or even omitted.

In practice, external tuning circuits and asymmetric samples may result in sufficient asymmetry in the electric field to complicate tuning and compromise tuning stability if the end rf shields 361, 362 are not very well grounded to the external rf shield. Shield arcs 363, 364 are also beneficial in reducing the electric field in the sample, and additional shield patches 365, 366 reduce inhomogeneity from cross-currents near the center. The lead shields 367, 368 also help improve filling factor by reducing lead inductance.

The inter-loop stray capacitors in the shield arcs and especially in the cross-current shield patches 365, 366 produce additional modes, but they need not interfere with tuning, as they are normally further from the fundamental than are, for example, the additional modes in a birdcage.

With shields as described above and at frequencies from DC to near self resonance, the optimized E1TI litz coil with diameter $d_c$ (in mm), external rf shield diameter $s \cdot d_c$, and central flux window inside length $h_1$, has approximate inductance L (in nH) as follows for typical conductor widths and length ratios:

$$L \cong 1.9 d_C \frac{(s-0.95)}{s} \left(\frac{h_1}{d_C}\right)^{0.6}$$

Note that the coefficient has units of nH/mm, and s is dimensionless with typical value of 1.15 to 1.5. The inductance lies in the range from 3 to 60 nH for coils from 6 to 70-mm diameter with typical sample lengths and external rf shields and is about the same as that of a narrow-band slotted resonator of comparable size. With a closely spaced external rf shield, self-resonance $f_0$ typically occurs for a $f_0 d_c$ product of 8–24 MHz-m, depending on various shielding details. As such, this coil is most likely to see applications in 6-mm to 70-mm MR $^1H/^{19}F$ microscopy coils for use at 24 T to 3 T, or for multinuclear MRI/MRS microscopy coils ranging from 15 to 150 mm at fields from 24 T to 2 T. In the larger sizes, the coil may be readily tuned over full multi-nuclear ranges using conventional methods with remote tuning capacitors without significant loss in sensitivity or homogeneity. In this case, the leads to each semi-coil carry full quadrant current, so their inductance must be minimized to maintain high filling factor and they must be shielded from the sample to prevent MRI signals near the gradient null point from folding back into the image. The internal cylindrical rf shields serve both purposes.

The optimized E1TI coil has typical $B_1$ inhomogeneity σ, defined as the mean absolute $B_1$ deviation divided by mean transverse $B_1$ throughout the sample region, of about 9% for a sample diameter and length 86% of the coil diameter $d_c$, where $h_1=0.7 d_c$, and s=1.2. For $h_1=d_c$ and s=1.5, σ is less than 5%. Filling factor $\eta_F$ (defined conventionally as the magnetic energy in the transverse component throughout the homogeneous region divided by the total magnetic energy throughout all space) ranges from about 10% to about 40% as s goes from 1.2 to 2.5, while the more general definition of $\eta_F$ in terms of a rotating component of the linear field is one half of the above. Another important parameter in characterizing resonator performance is field rolloff beyond the homogeneous region and especially near the gradient null point, which is typically near $z=sd_c/2$. We define remote sensitivity ε as the filling factor for a cylinder of diameter 0.9 $d_c$ between axial locations $z_1+0.25\ d_c$, and $z_1+d_c$, where $z_1$ is the axial end of the homogeneous sample region, typically 0.6 $h_1$. Typically, ε is less than 4% of $\eta_F$ for the litz coils. Equally important for large samples, maximum axial rf magnetic field in the sample near the azimuthal members is only one third as large as in conventional birdcages. Hence, inductive loss in sample material in this region is reduced and S/N is improved.

The E1TI litz coil is not likely to find many applications in high-resolution NMR spectroscopy, as the crossovers in the center of the coil are very difficult to make totally non-magnetic. While strict magnetic compensation is not necessary for any of the intended imaging applications, it is good practice to make the crossover feedthroughs between the two surfaces through fine slits using copper foil that just fills the slits to minimize the magnetic disturbance caused by holes in the dielectric substrate. Other versions of a 1-turn litz coil will be described later that are better suited to high-resolution NMR spectroscopy.

A further improvement in sensitivity of up to 40% is possible from quadrature operation when sample losses dominate. For frequency-diameter products below 5 MHz-m, optimized linear operation is generally better than quadrature operation. Above 15 MHz-m, quadrature operation is usually superior. All of the litz coils illustrated herein are linear resonators. Where radial space permits, quadrature operation can readily be accomplished by concentrically mounting two transparent linear resonators, of slightly different diameters, tuned to the same frequency, aligned with the x and y axes respectively. In the discussion heretofore, the transparency emphasis has related to self-generated rf fields. For quadrature operation, the resonators must also be transparent to orthogonal rf fields, which is usually more readily achieved with equal-area litz groups.

The most significant difference for quadrature operation is that the outer axial conductor elements 323, 325 must be significantly narrower and the inner axial conductor elements should be slightly narrower than for optimized linear operation. The E1TI semi-coil illustrated in FIG. 3 (with tabs 341, 342, 343, 344 omitted) is appropriate for one of the coils in quadrature operation. The only disadvantage of the linear litz coil compared to the birdcage for quadrature operation is the extra radial space the litz coil requires, but this disadvantage is offset many times over by its other advantages.

The conventional birdcage may be made into a quadrature litz coil by simply replacing the conductor elements (rungs and rings) with woven foil. For relatively long birdcages, this results in substantially improved $B_1$ homogeneity for a given number of rungs and thus permits tuning simplification by reducing the number of rungs typically required for high $B_1$ homogeneity from sixteen to eight.

However, tuning is still much more difficult than for two orthogonal linear litz coils. Minor improvements in the conventional birdcage are also sometimes possible at low frequencies by replacing the conductor elements (rungs and rings) with conventional litz wire, especially if the wire is woven loosely enough to be spread out to cover a substantial portion of the surface of the birdcage.

The optimization criteria thus far have neglected frequency dependence, as electric field effects are better addressed through capacitive segmenting as discussed below, but reducing inductance by chamfering corners and reducing subtending angles beyond that indicated by standard rf optimization of $\eta_F$, Q, $\sigma$, and $\epsilon$ is sometimes required for the highest frequencies.

The standard Alderman-Grant modification may be applied to convert the E1TI litz coil to what may be called a half-turn coil: the short 303 is replaced with a segmenting capacitor 303C to achieve quadrupolar electric balance. This reduces effects of stray capacitance and sample dielectric losses by a factor of 2 to 4 and extends the effective range of the coil upward by about a factor of 1.5 to 1.9 (self-resonance product about 12–40 MHz-m), but the tuning range is more limited. We denote this coil as the etched-half-turn-tunable (EHTT) litz coil, as another half-turn coil will be presented later that has a more severely limited tuning range.

The EHTT coil is likely to find applications for $^1$H/$^{19}$F, $^{13}$C/$^{23}$Na, and similar narrow-range applications at somewhat larger sizes or higher fields than the E1TI coil. With tightly coupled semi-coils, it easily tunes over a 6% frequency range with no significant effect on $B_1$ homogeneity by adjusting just one of the four capacitors. Adjustment of just two capacitors (one in each semi-coil) doubles the tuning range to 12%, and simultaneous adjustment of all four capacitors (which is often feasible) allows full multi-nuclear tuning with no significant degradation in Q, $\sigma$, $\epsilon$, or $\eta_F$ in many cases.

Figure 4A:
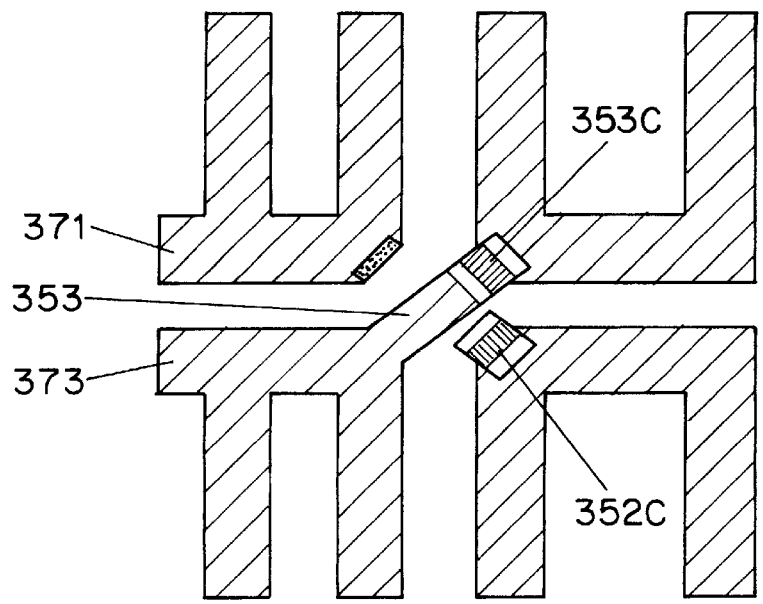
FIG. 4 illustrates the use of central segmenting capacitors within litz super-groups.
Figure 4B:
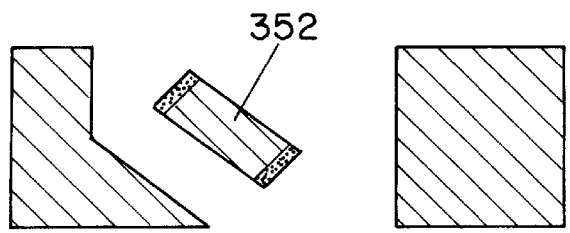
Figure 4C:
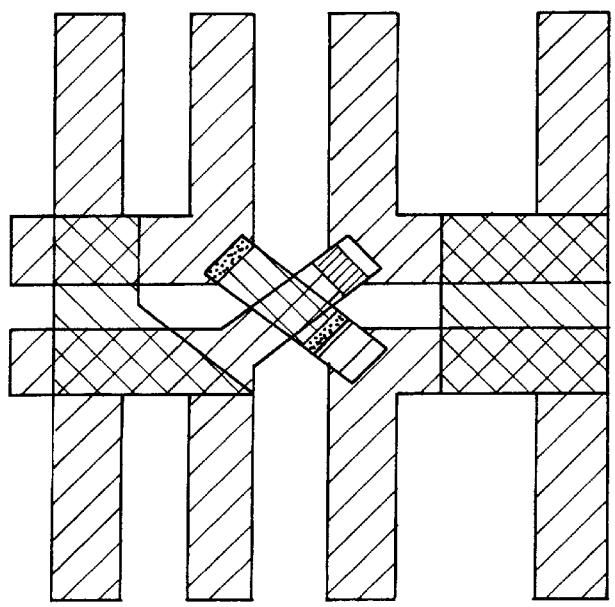

The symmetry of the litz super-groups allows the capacitive segmentation to be easily taken one step further without affecting $B_1$ homogeneity. FIGS. 4a and 4b illustrates a method of inserting central segmenting capacitors 352C, 353C into crossovers 352, 353 (and their equivalent counterparts in each quadrant) to convert the EHTT coil to an etched-quarter-turn imaging (EQTI) coil with no significant loss in sensitivity or $B_1$ homogeneity in most cases. Effects of stray capacitance and dielectric losses are reduced again, and the frequency range is extended upward by another factor of about 1.2 to 1.5, making its self resonance frequency-diameter product in the range of 15 to 60 MHz-m, which is suitable for whole-body MRI at least up to 2 T. In most cases, relative conductor widths on EQTI coils will be less than indicated in FIG. 3, as they are likely to be used only where inductive sample losses dominate. Central paralleling tabs 371, 372, 373, 374 are particularly effective in suppressing extraneous modes in the EQTI coil.

Because the central segmenting capacitors control current balance between parallel, resonant members, they must be matched to within one percent or $B_1$ homogeneity will be significantly affected. This is comparable to the requirement for all of the capacitors in a birdcage, and it implies that it is not practical to make the central segmenting capacitors user-variable. Hence, the tunability of the EQTI coil is rather limited. However, simultaneous adjustment of the four end segmenting capacitors (301, 303C and their symmetric counterparts) allows a 12% tuning range without concern about spoiling $B_1$ homogeneity, and the tuning range may be twice that with modest sacrifice in various parameters. For comparison purposes, precision adjustment of four tuning capacitors for one of the modes in a centrally segmented 12-rung birdcage is not likely to achieve more than a 1% tuning range before the $B_1$ homogeneity is severely spoiled. Hence, the EQTI litz coil and similar litz foil coils with even more segmentation in the outer loop are vastly superior to alternative birdcage designs for such difficult applications as flexible torso coils in MRI.

High-resolution (HR) NMR Spectroscopy Coils.

Figure 5A:
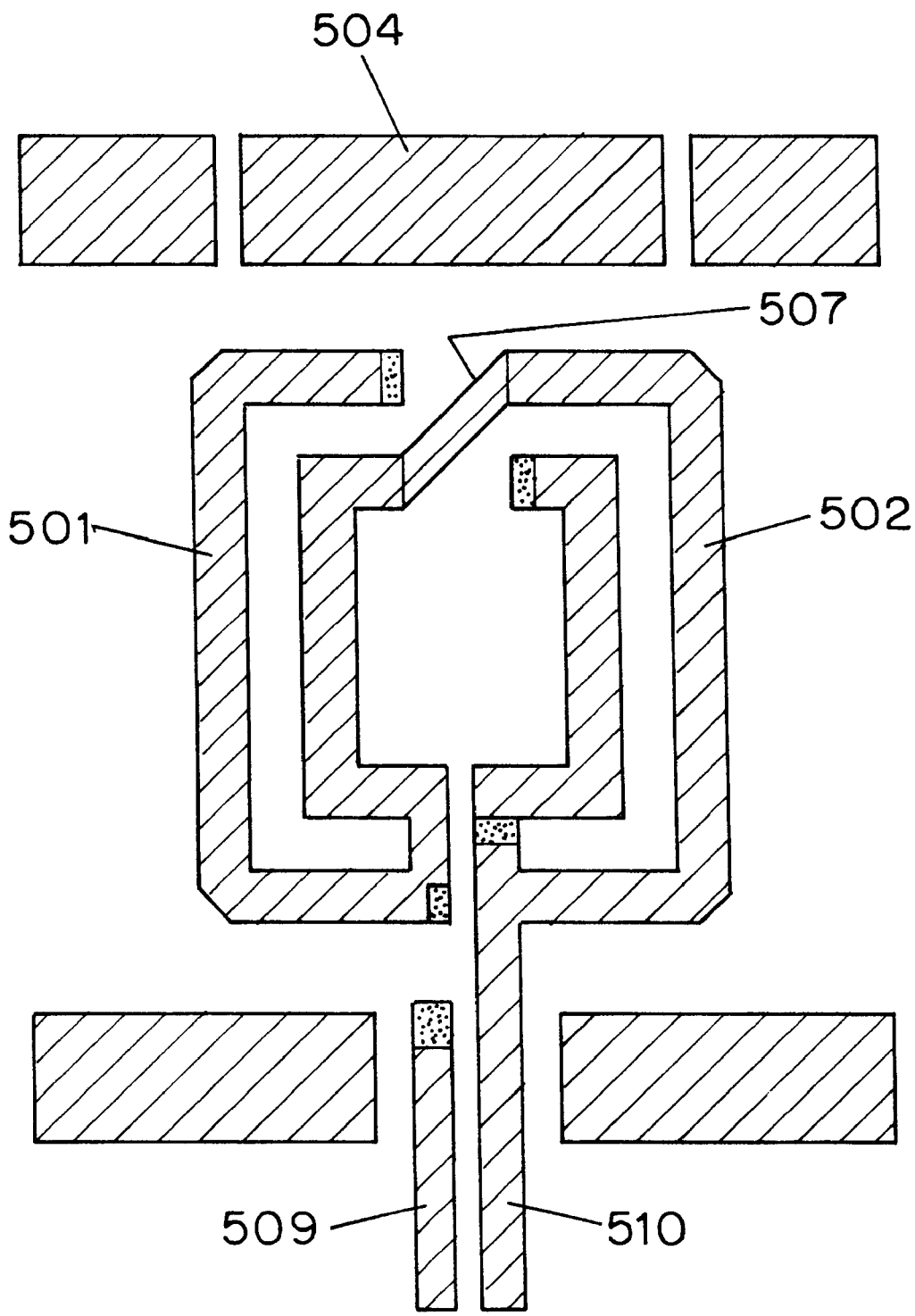
FIGS. 5a, 5b, and 5c illustrate foil patterns for the outside, inside, and composite of an etched-3-turn (E3T) litz semi-coil.
Figure 5B:
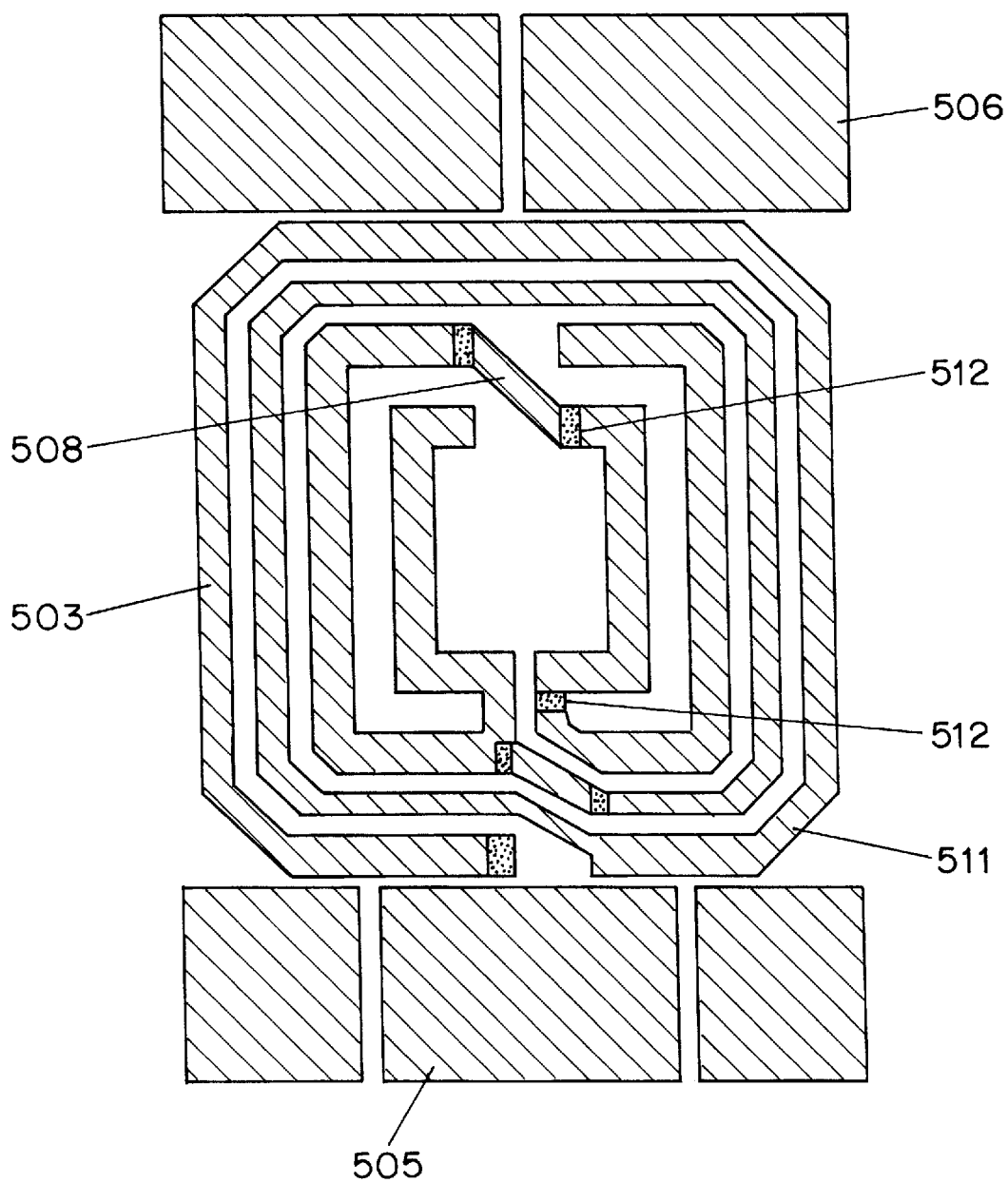
Figure 5C:
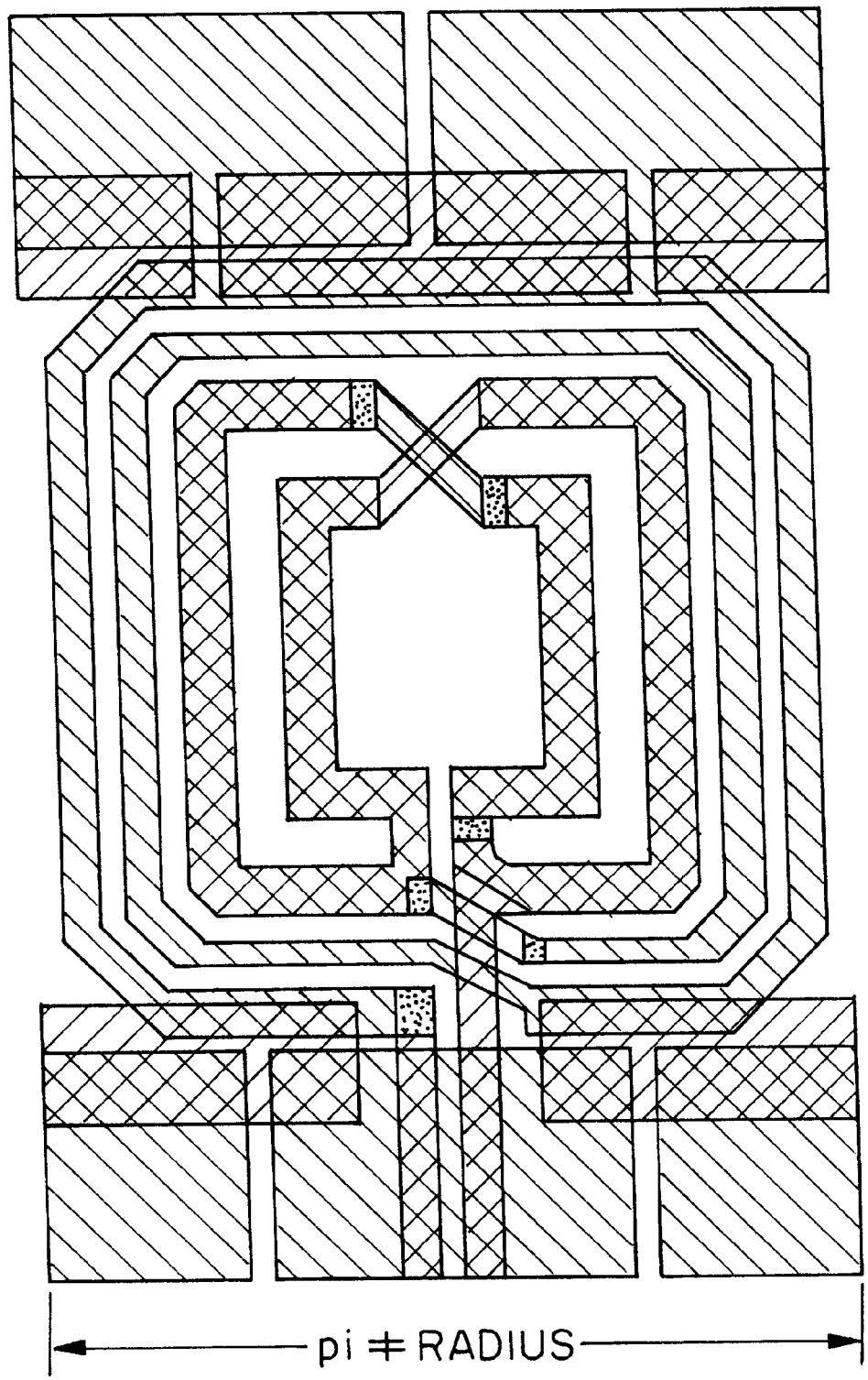

We turn now to the other end of the spectrum and then work back to the middle. FIGS. 5a, 5b, and 5c illustrate an etched-3-turn (E3T) litz semi-coil suitable for multi-nuclear high-resolution NMR of low-gamma nuclides and microsamples. Here, most of the coil elements would be on the inside surface (FIG. 5b) for the smallest coils, as this improves filling factor. Some duplicate elements may be added to the outside surface along with the crossovers to improve Q. The inner turn consists of a single litz group 501, 502 and the rest of the coil 503 looks rather conventional except for the fact that it is a copper semi-coil etched on a double-clad dielectric substrate with segmented shield foils 504 over the end arcs. The cylindrical rf shields 505, 506 at each end are also slit (for improved PFG performance) in such a way that the shield under the leads is not broken and overlapping shielding by patches on the other surface is feasible. Duplicating and paralleling the inner turns 501, 502 except where prevented at the crossovers 507, 508, helps Q more than it hurts filling factor or self resonance on very small coils and thus helps sensitivity.

Optimization criteria for high-resolution NMR spectroscopy involve the same parameters as for MRI ($\eta_F$, Q, $\sigma$, $\epsilon$, L, although there is more emphasis on $\eta_F$ and Q) and the additional requirement of incredibly strict magnetic compensation. (It should be noted that while FIG. 3 was an approximate scaled optimized pattern for a particular set of conditions, the other Figures are generic representations only.) The leads 509, 510 from the two semi-coils on opposite sides of the cylinder are usually connected in parallel far enough from the sample region (typically 15 mm) that magnetic perturbations from the soldered joint are of no concern, but it is important that the lead inductances from each semi-coil to the point of parallel connection be equal to avoid degrading $\sigma$. Since only the central region can be shimmed to high $B_0$ homogeneity, the leads must be fully shielded from the sample by internal cylindrical shield 505 to keep them from picking up signals from sample located in regions of inhomogeneous $B_0$ and thereby distorting spectral lineshape. Lineshape may also be enhanced by the use of chamfered or radiused corners 511, as this significantly reduces transverse $B_1$ and hence signal sensitivity on the sides at the ends of the coil with little effect elsewhere. As a result, signals from this region, where $B_0$ cannot easily be homogenized, are attenuated.

For moderate sample sizes, thin (16 Pm) copper cladding has acceptably low magnetism, but this may not be the preferred approach, as Q is improved by using a thicker foil, even though the litz coils have much lower current concentrations at the foil edges than conventional coils. Even with very thin foil, for samples below 7-mm where the coil will be within a fraction of a millimeter from the sample, it is necessary to plate the diamagnetic copper (X=−9.8 ppm, SI volumetric units) foil with an appropriate thickness of a paramagnetic (positive susceptibility) metal having a low temperature coefficient of magnetism such as aluminum (X=21 ppm) or iridium (x=38 ppm) or rhodium (X=168 ppm) to achieve highest $B_0$ homogeneity.

To maintain a high Q, the paramagnetic plating must then be copper plated to a thickness of several skin-depths at the lowest frequency of intended use. The optimum paramagnetic plating thickness is such that the algebraic sum of the products of the thickness and susceptibilities in the foil is zero. In practice, it is difficult to control plating thicknesses to high precision, and susceptibility magnitudes greater than 3 ppm can be expected in places, especially near the edges of the foil traces. Thus foil thicknesses must still be kept quite small, and copper is preferred over silver (x=−24 ppm) because of its lower magnetism. A gold flash over the copper plating will help prevent the formation of highly paramagnetic copper oxides and chlorides without significantly affecting Q.

As long as the substrate is homogeneous, has uniform thickness, and is much longer than the sample region, its susceptibility is immaterial. However, it may contribute unwanted background NMR signals, especially in solids NMR or in liquids $^1$H NMR from absorbed water. These problems may be circumvented by the cut and folded coils described later.

In most cases, sufficiently non-magnetic feedthroughs 512 at the crossovers may be made using 0.02-mm×1-mm×1-mm copper foil through 0.03-mm×1.1-mm slits in the etched laminate, with the feedthroughs ultrasonically bonded to both surfaces. Suitable slits may be cut with a laser. The problem is reduced by minimizing the number of feedthroughs, especially near the central region.

Figure 6A:
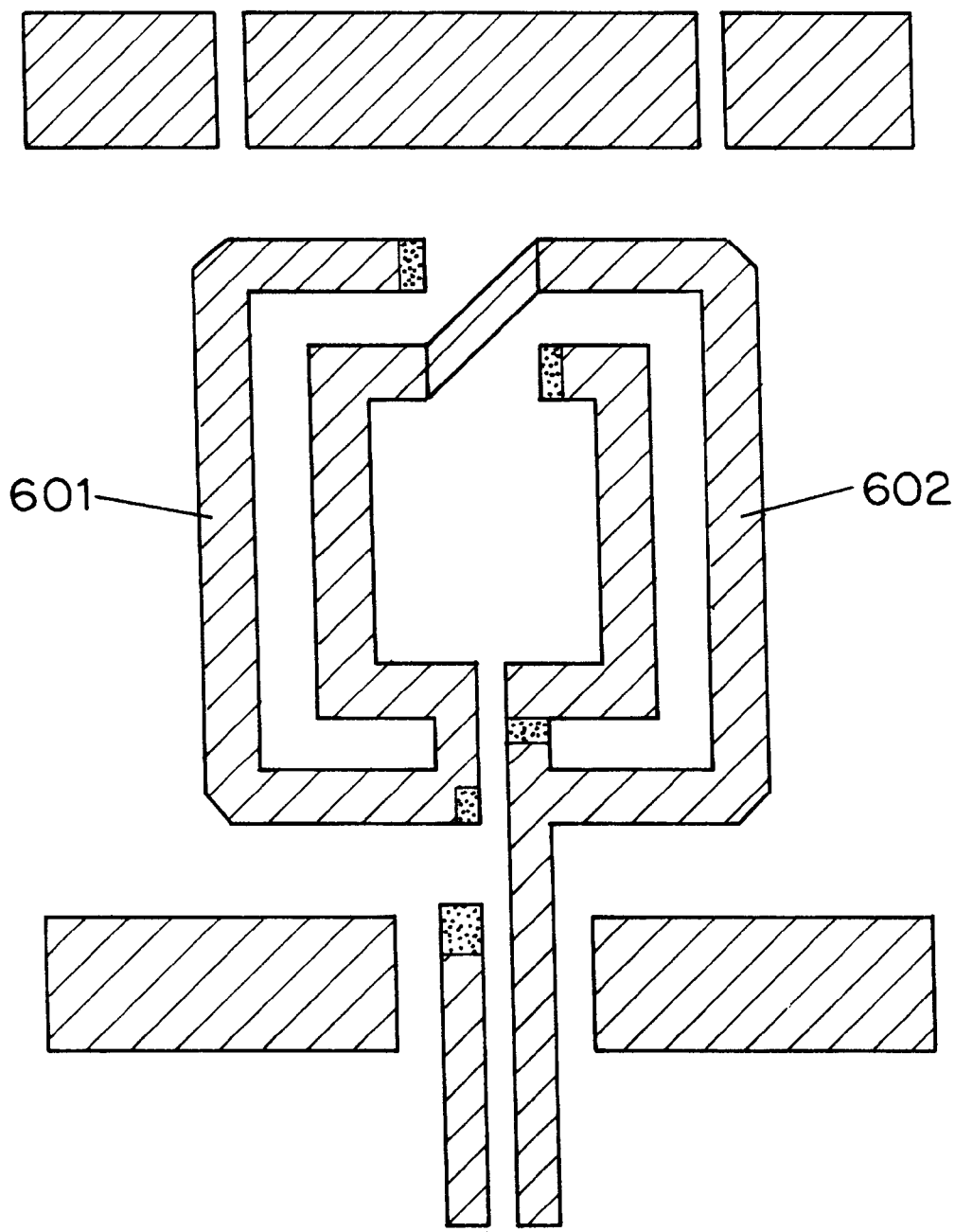
FIGS. 6a, 6b, and 6c illustrate foil patterns for an etched-2-turn litz (E2T) semi-coil.
Figure 6B:
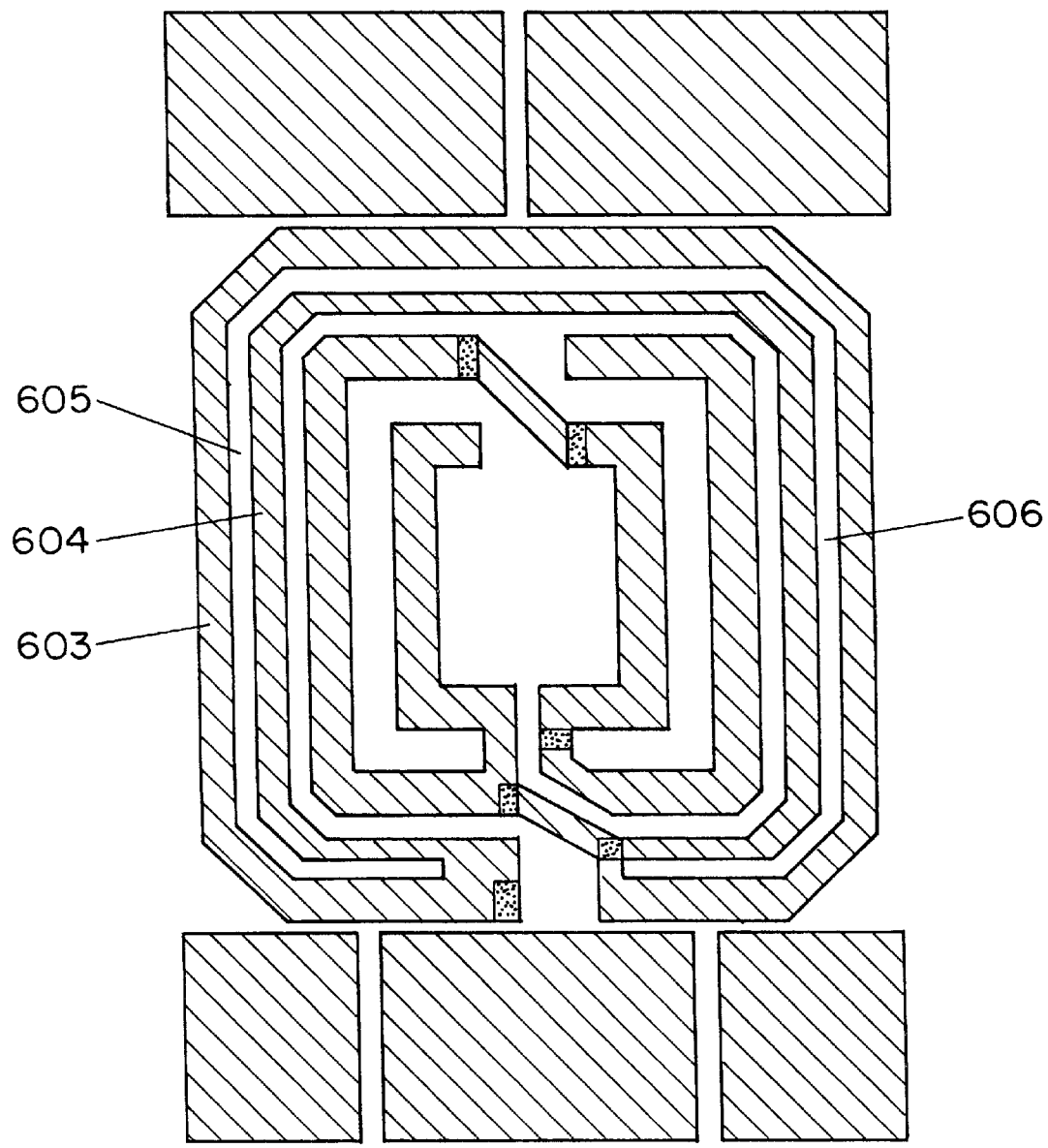
Figure 6C:
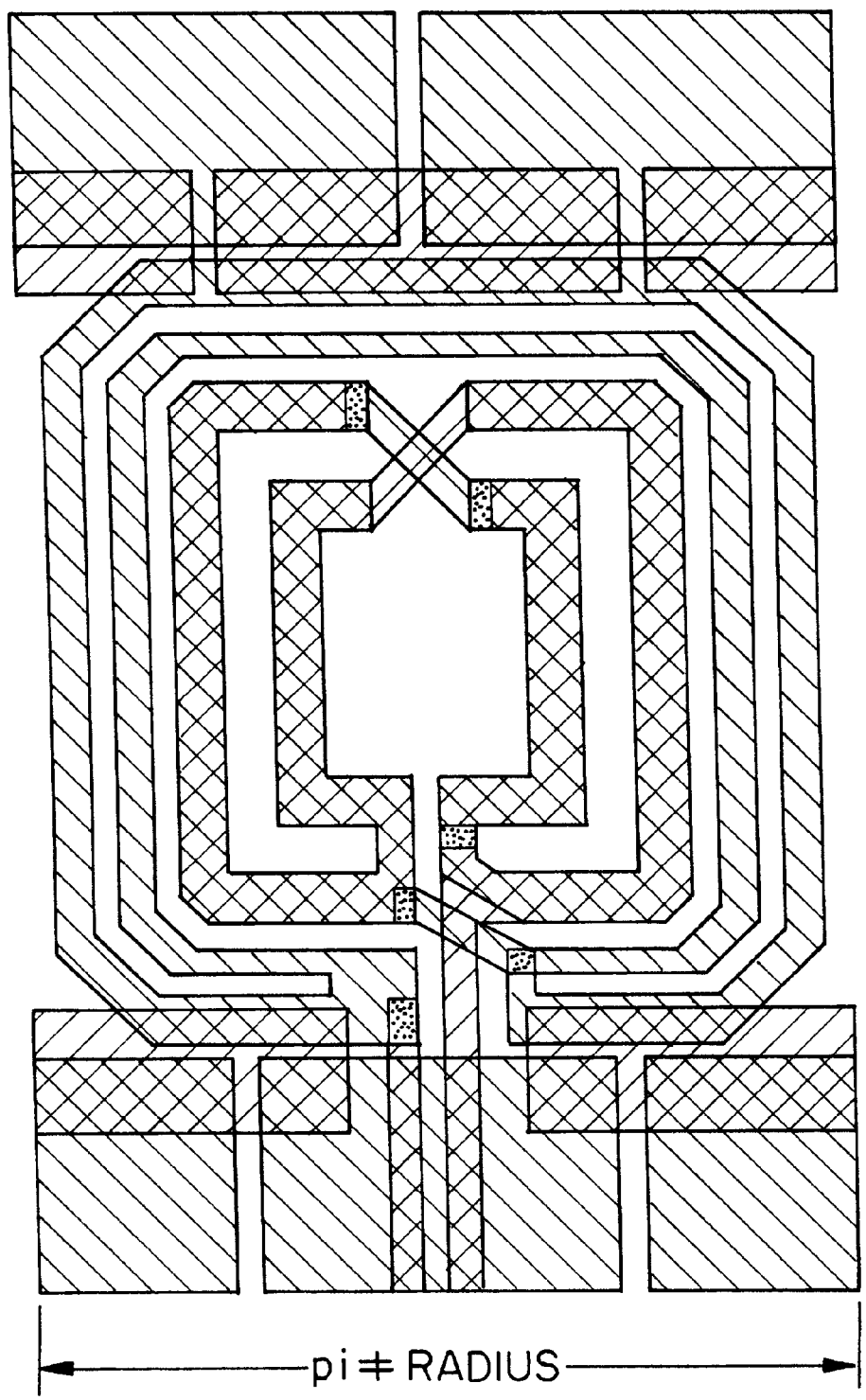

For high-resolution NMR on somewhat larger samples or higher frequencies, the etched-2-turn litz (E2T) semi-coil shown in FIGS. 6a, 6b, 6c is better suited. Here again, a litz group 601, 602 is used only on the inner turn to minimize the magnetic compensation problems associated with feedthroughs. Again, the inner turns may be duplicated as shown, although this adds three feedthroughs and their associated difficulties in magnetic compensation. The outer turn is slit to form two parallel conductors outer loop 603, and inner loop 604 but without a crossover. Hence, the outer turn is not a litz group and the current on its inner loop 604 is considerably greater than the current in its outer parallel loop 603. However, the slit in the outer turn is substantially transparent to orthogonal rf fields, as flux entering one side 605 would exit the other side 606 and the loop voltage induced in the outer turn by an orthogonal field would be essential zero. This allows the reduced self inductance of a wide conductor without obstruction of orthogonal fields. However, such an arrangement for the inner turn 601, 602 would result in poor $B_1$ homogeneity and would not be significantly different from the prior art.

Figure 7A:
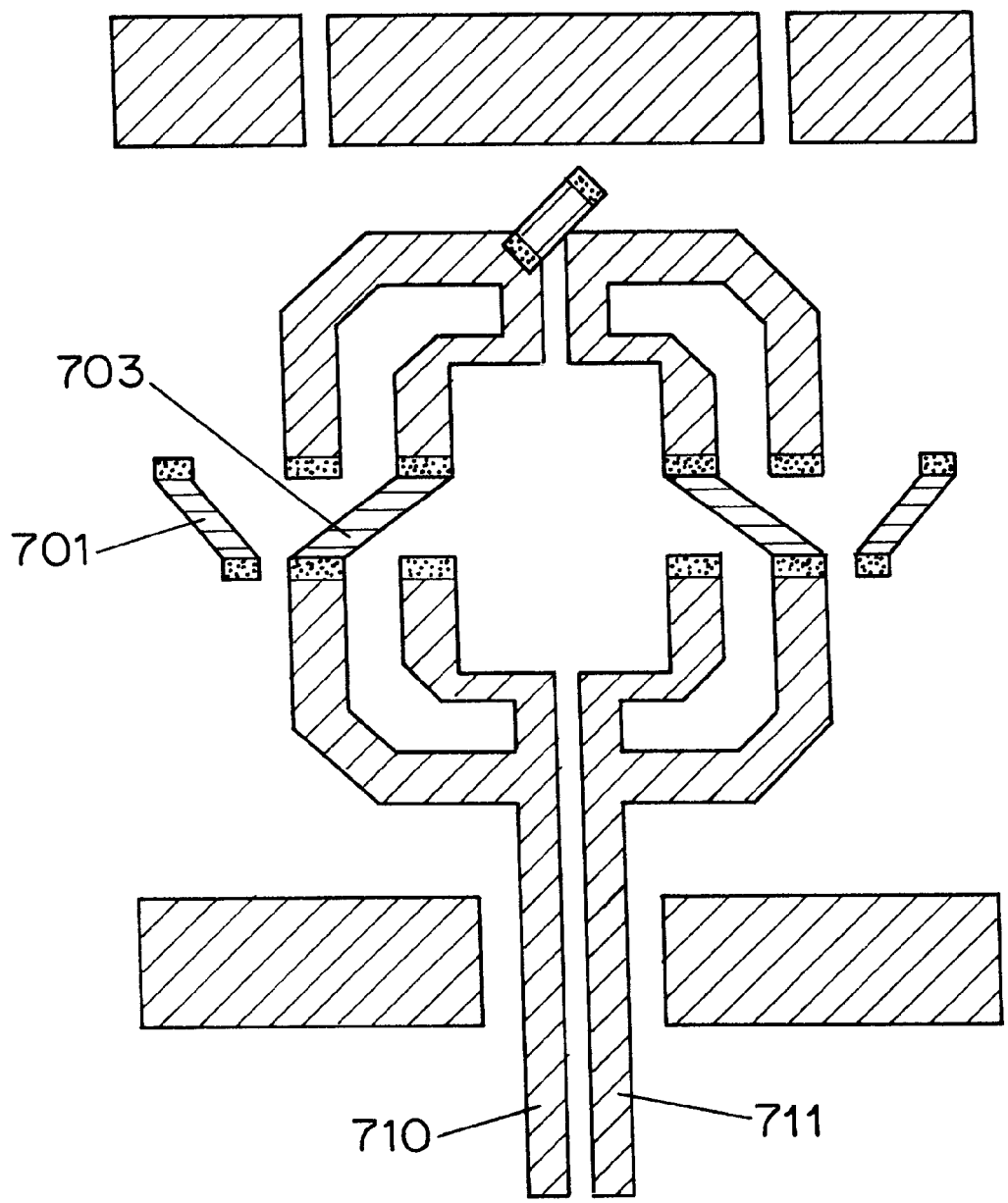
FIGS. 7a, 7b, and 7c illustrate foil patterns for the etched-2-turn-imaging (E2TI) semi-coil.
Figure 7B:
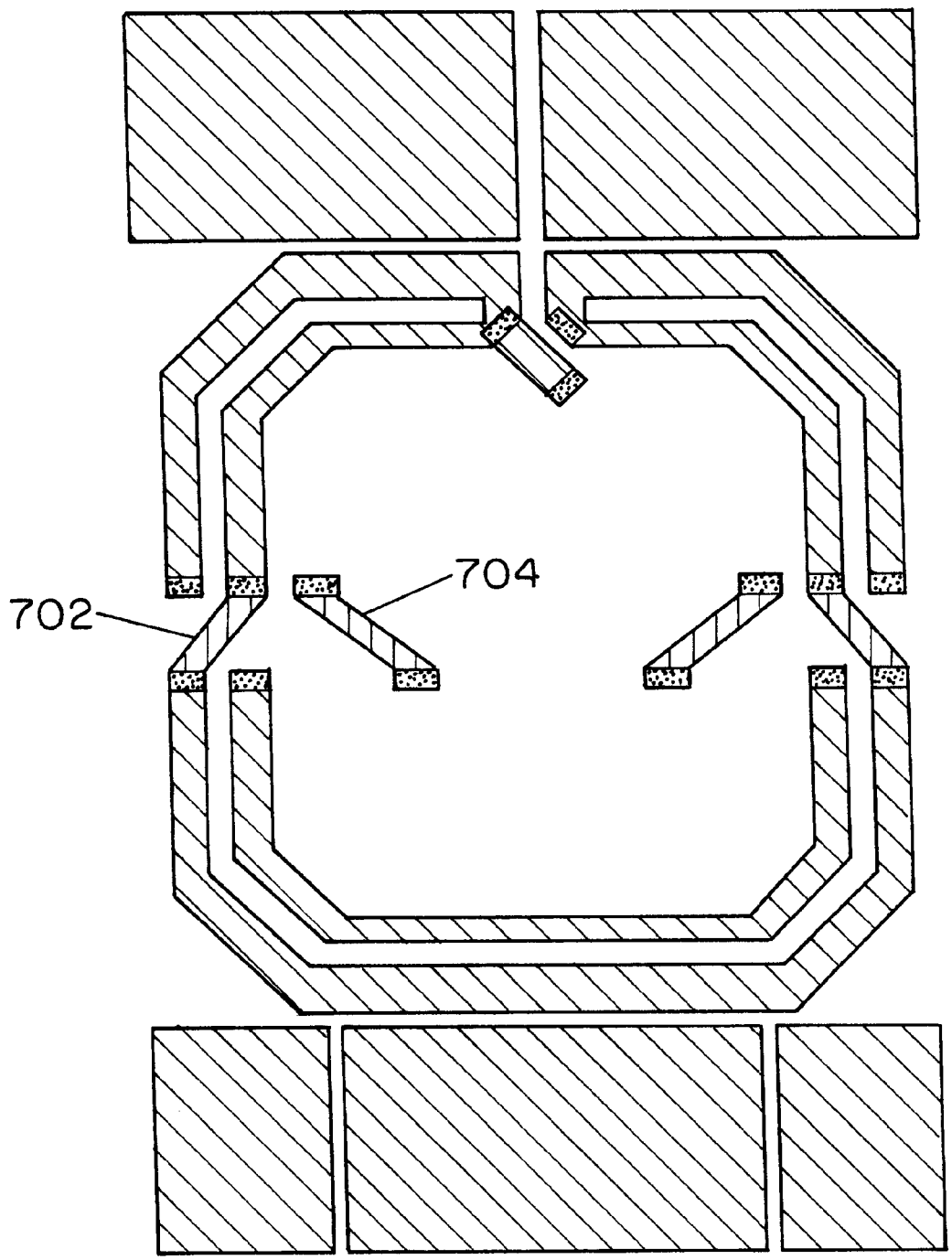
Figure 7C:
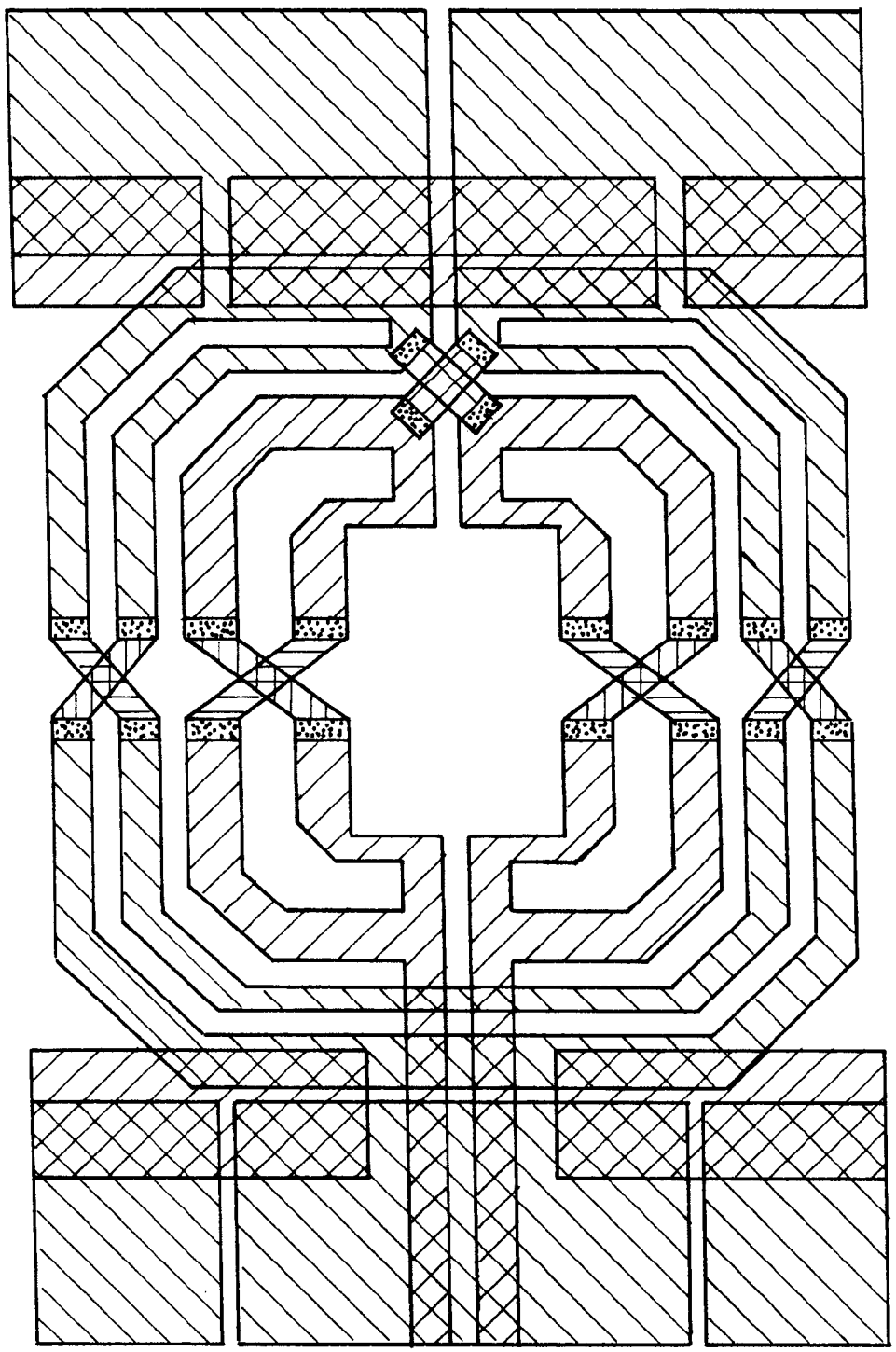

An alternative 2-turn litz semi-coil with higher symmetry is shown in FIGS. 7a, 7b, 7c that is easier to optimize for high $B_1$ homogeneity and thus will be called the etched-2-turn-imaging (E2TI) coil. It also may exhibit higher self-resonance when conductor widths are quite narrow because of its improved electric field symmetry, as both leads 710, 711 are connected to the inner turn. However, the use of four crossovers for example crossover 701, 702, 703, 704 per quadrant near the center makes magnetic compensation for critical NMR spectroscopy more difficult.

Another approach to lead arrangements for etched 2-turn and etched-1-turn litz coils that is likely to be more popular for high-resolution NMR spectroscopy at high fields is presented later in FIGS. 15 and 16.

Figure 8A:
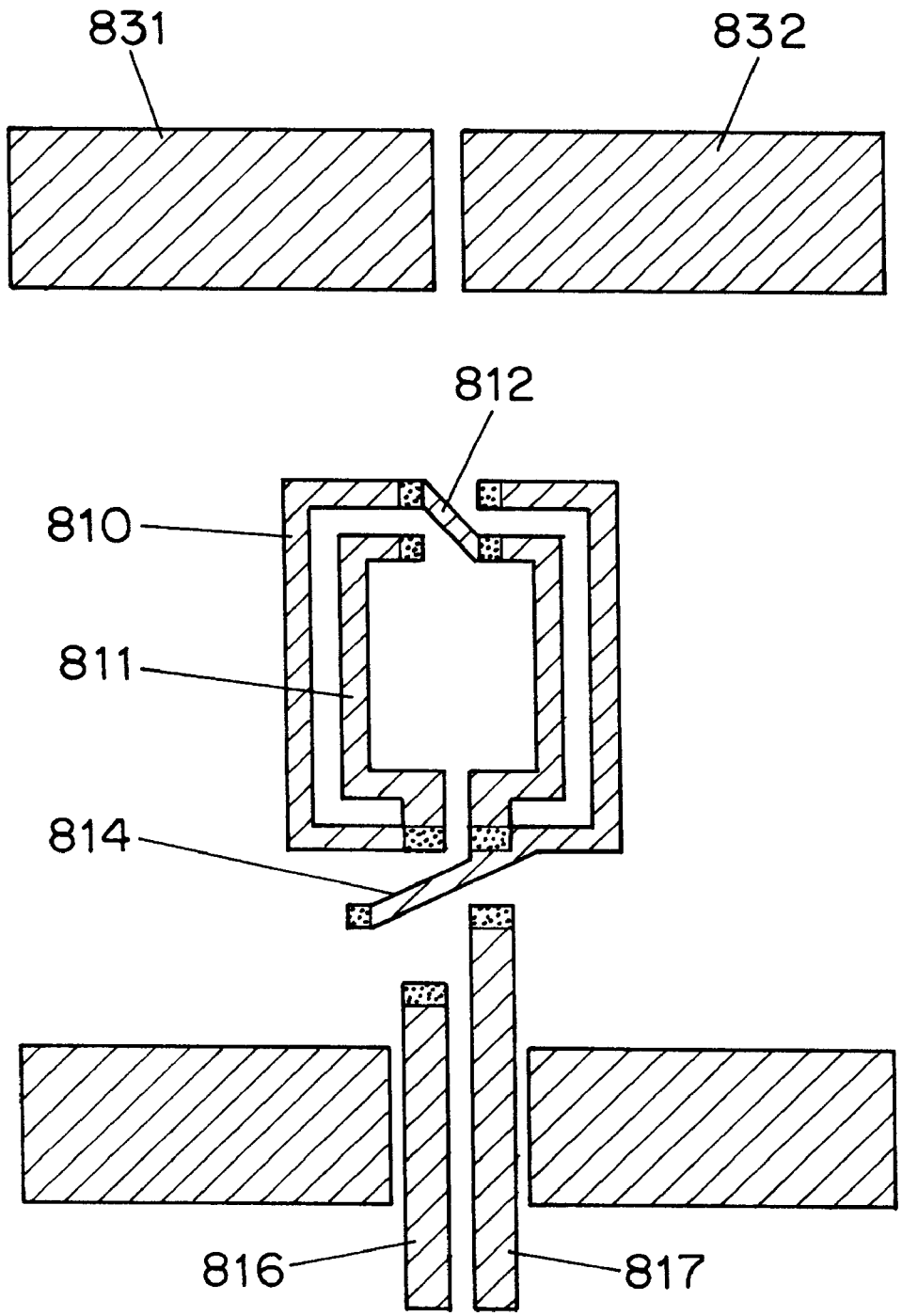
FIGS. 8a, 8b, and 8c illustrate foil patterns for an etched-1-turn litz (E1T) semi-coil.
Figure 8B:
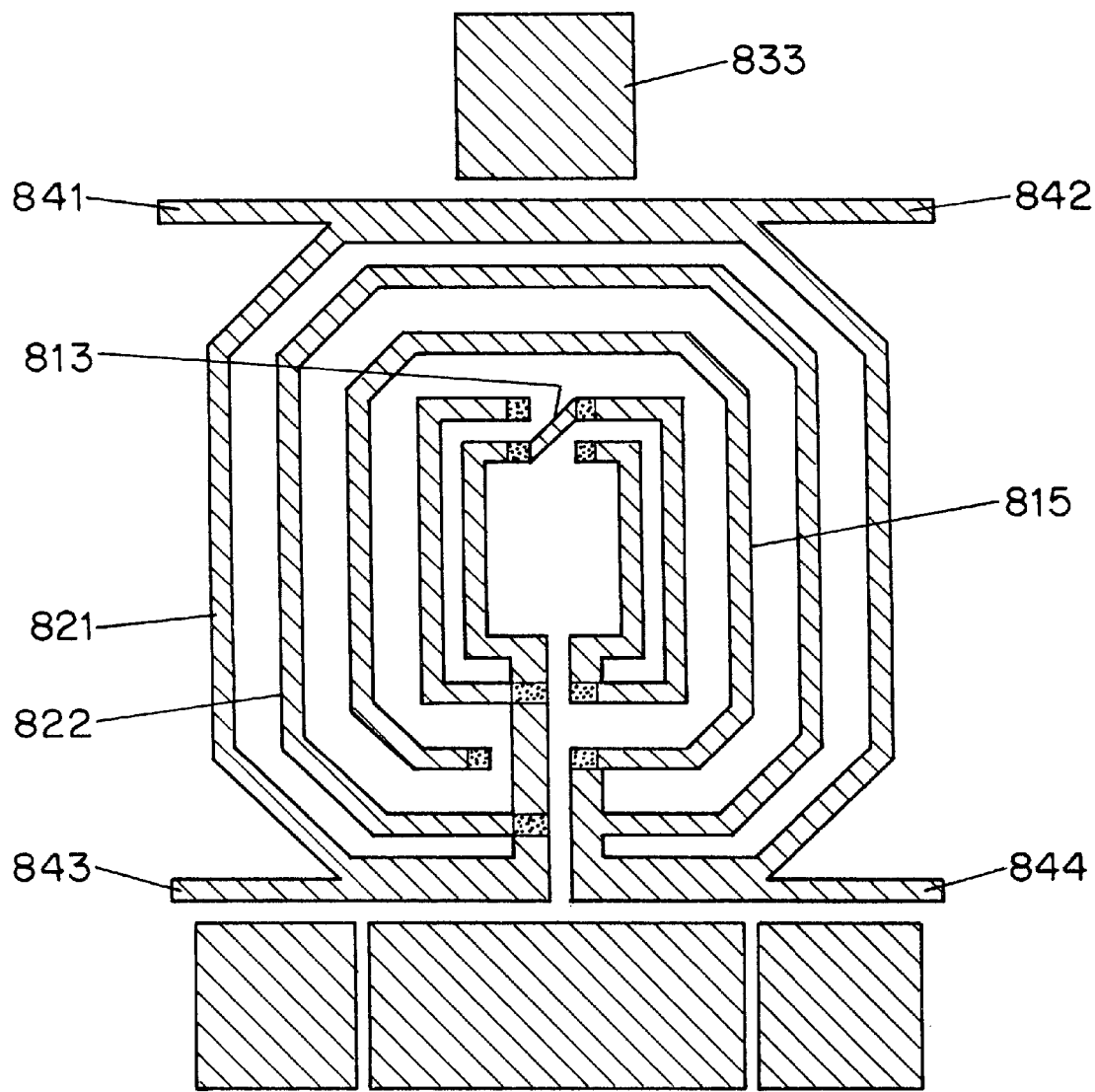
Figure 8C:
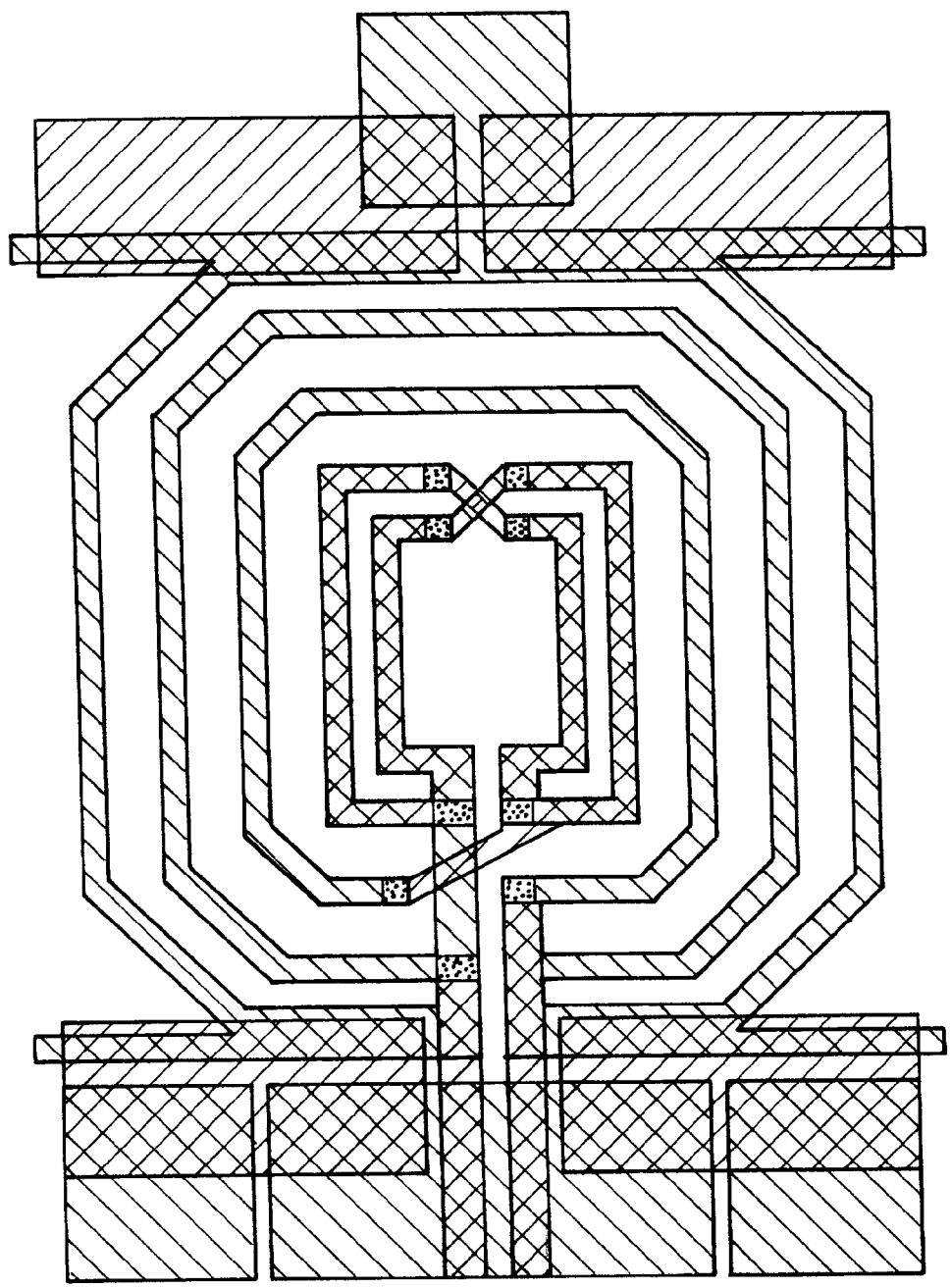

For somewhat larger sample volumes or higher frequencies, the etched-1-turn litz (E1T) semi-coil of FIGS. 8a, 8b, 8c may be preferred for NMR spectroscopy (and some MRI) applications because of its improved Bo homogeneity (from the absence of central crossovers) compared to the E1TI coil described earlier. (In fact, the E1TI coil will have few applications. It was presented primarily as a springboard into the EHTT and EQTI coils.) The E1T coil includes an inner litz group 810, 811, 812, 813 in series with crossover 814 and mid loop 815 forming a litz super-group in parallel with the outer loops 821, 822. Central crossovers could be inserted into loops 821, 822 for improved $B_1$ homogeneity, but this would compromise the critical $B_0$ homogeneity requirements for which this coil is designed. The upper cylindrical shield is shown formed from a series of overlapping patches 831, 832, 833 to reduce eddy currents during PFG experiments. Where lineshape is not critical and where transparency to orthogonal fields is not required, the two semi-coils may be paralleled by connecting tabs 841, 842, 843, 844.

The E1T coil will find applications in 9 to 150-mm diameter coils for $^1$H/$^{19}$F NMR at fields up to 12 T, as it provides much higher $B_1$ homogeneity and Q than the prior art slotted resonator. With shields as described above, the total inductance L (in nH) of the E1T coil of diameter $d_c$ (in mm), external shield diameter $sd_c$, and central flux window length $h_1$, is approximately as follows:

$$L \cong 3.5 d_C \frac{(s - 0.95)}{s} \left( \frac{h_1}{d_C} \right)^{0.6}$$

To achieve comparable $B_1$ homogeneity, prior art coils would require at least three turns per side so as to limit the current in the conductor elements along the edge of the central flux window to ⅓ of the total current per quadrant. Such a coil, with both sides paralleled, has about four times the inductance of an E1T coil of comparable size.

The ultra-low inductance of a small E1T coil makes broadband and double tuning extremely inefficient unless lead inductance is kept even lower. Etching the coil on a double-clad laminate facilitates the use of ultra-low-inductance strip-line leads. However, the inductance of 2-mm-wide foil etched on 0.05-mm microwave double-clad laminate is still 0.3 nH/mm, which quickly becomes comparable to the inductance of a 6-mm E1T coil. Note that the leads 816, 817 in FIG. 8 are shown with a relative width that would be appropriate only for the highest frequencies. In most multinuclear applications, they would be two to three times wider. Again, another lead arrangement is presented later in FIG. 16.

Figure 9A:
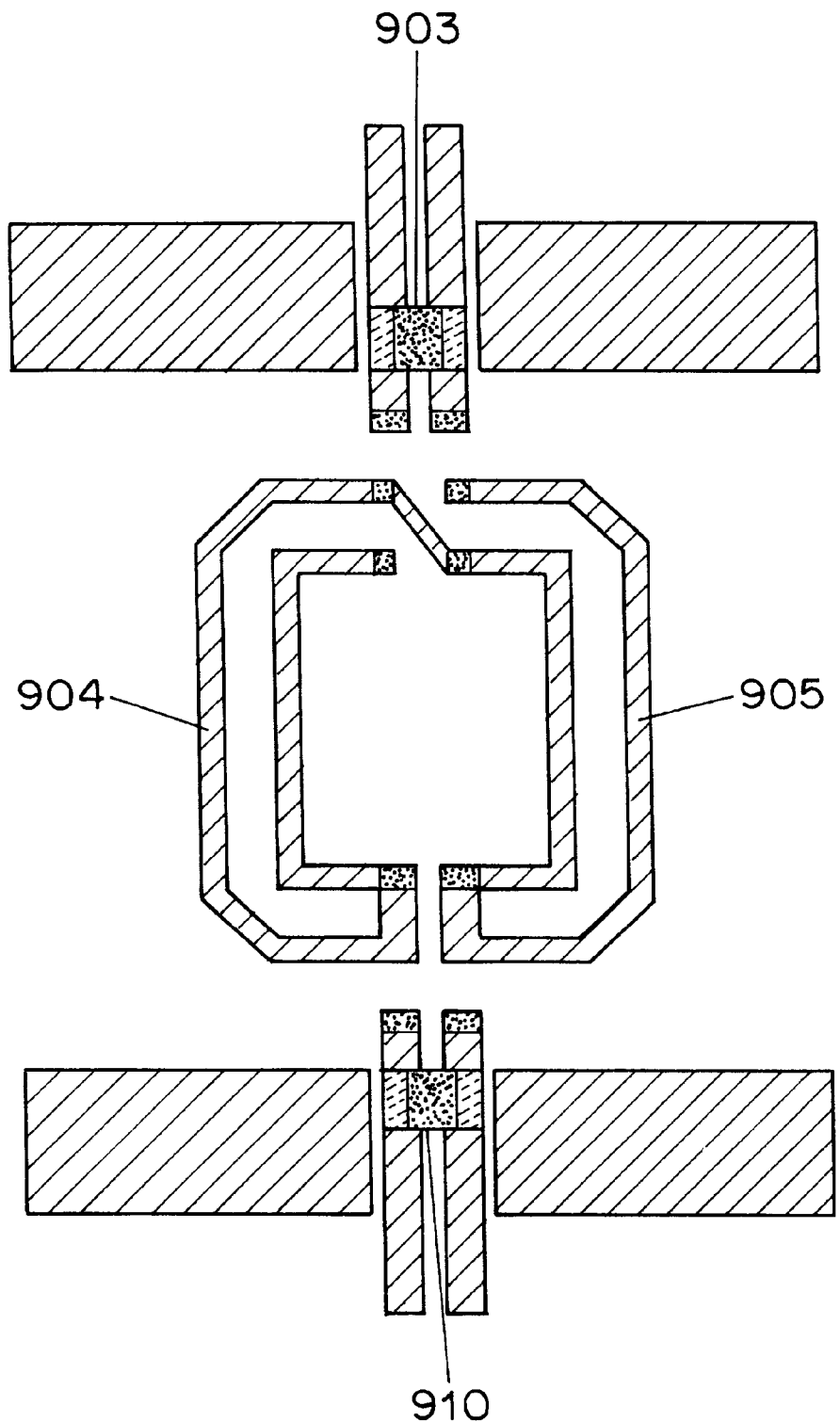
FIGS. 9a, 9b, and 9c illustrate foil patterns for the etched-half-turn fixed-frequency (EHTF) semi-coil.
Figure 9B:
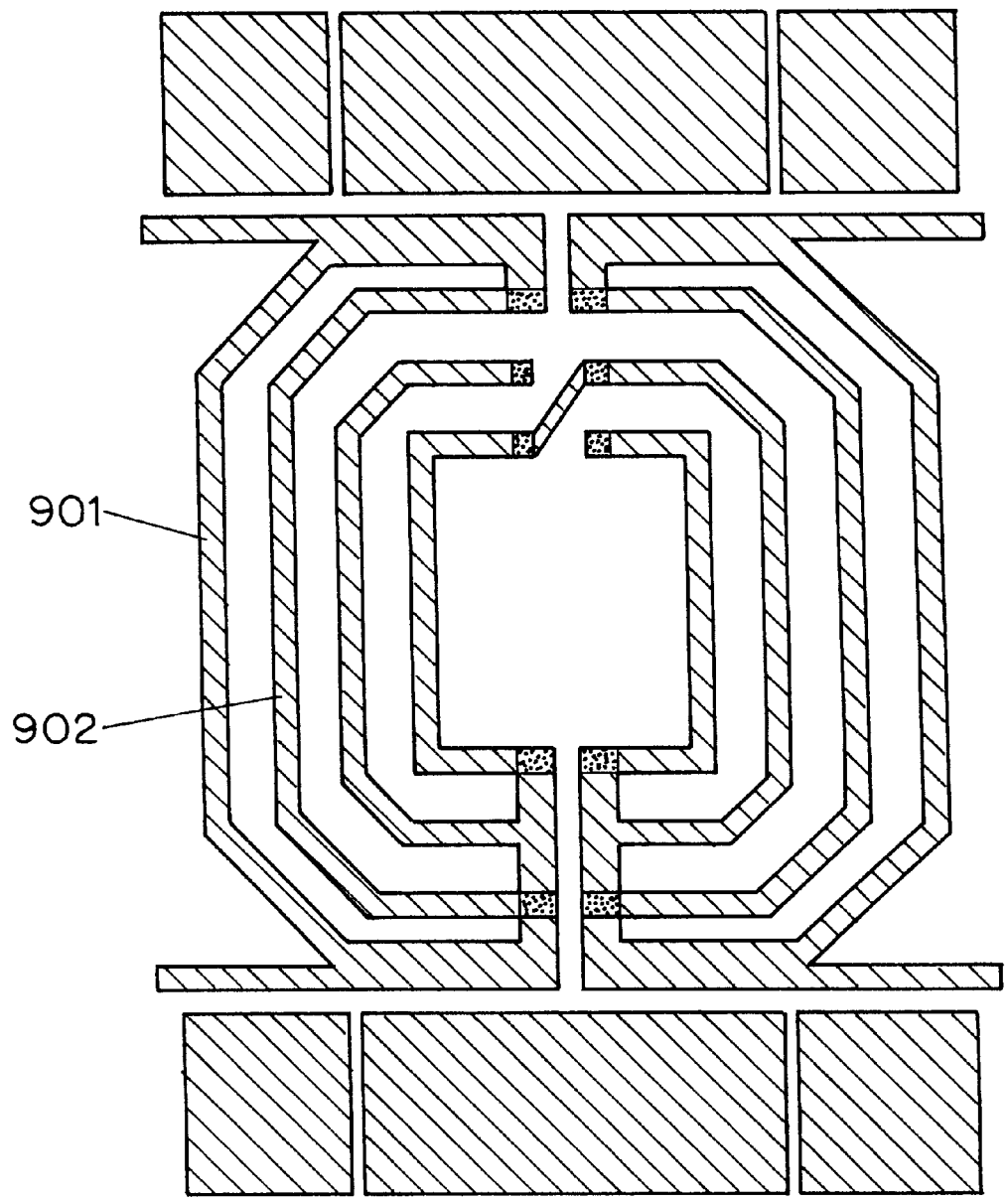
Figure 9C:
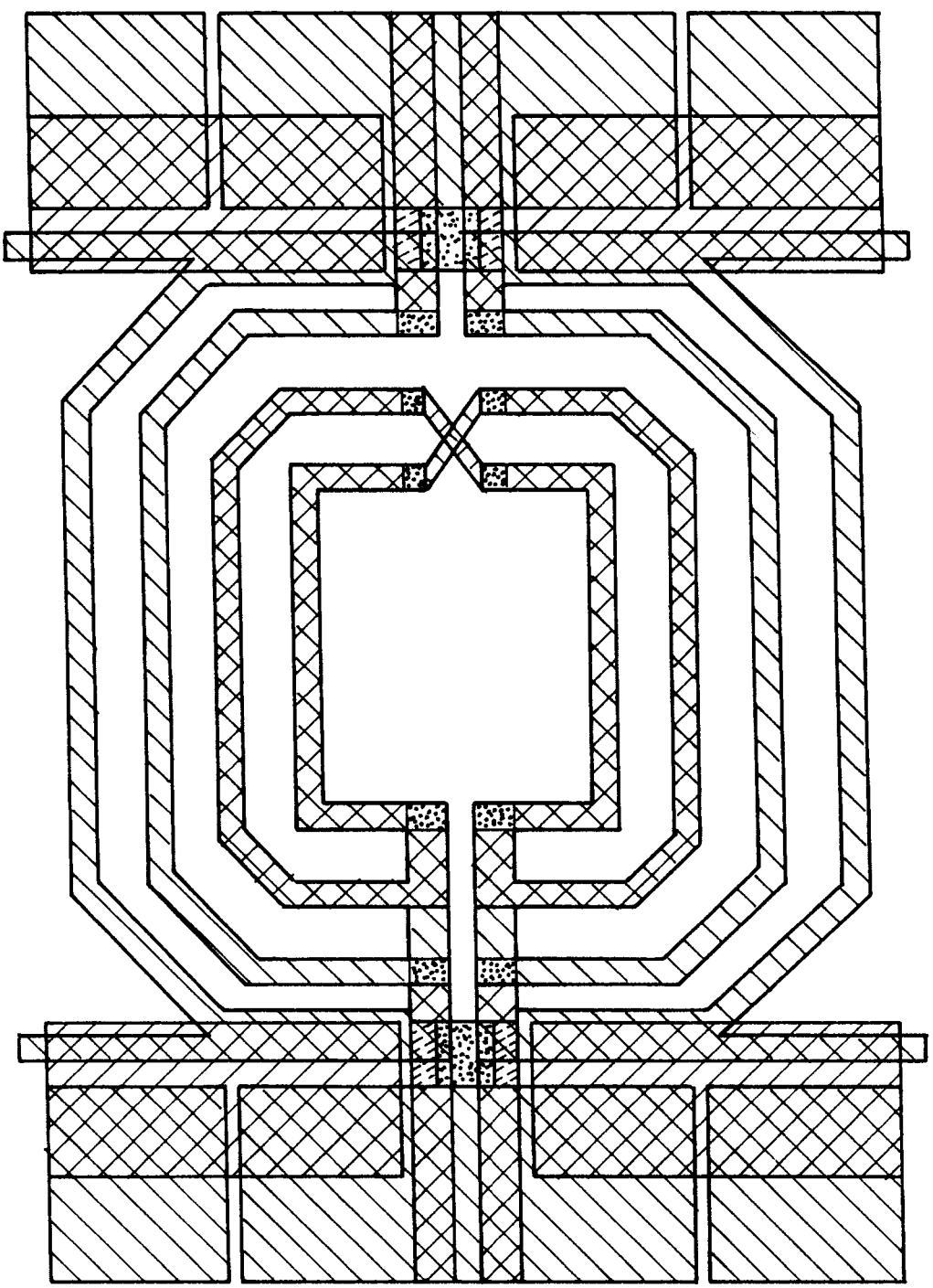

For larger samples at very high frequencies where magnetism is critical or for small solid samples where very high $B_1$ field strength is required, the etched-half-turn-fixed-frequency (EHTF) litz coil of FIGS. 9a, 9b, 9c may be preferred over the EHTT coil of FIG. 3, as the EHTF coil has no crossovers near the center. However, the outer loops 901, 902 are capacitively segmented by capacitor 903 while the inner loops are continuous. Current on the inner loops 904, 905, which may appear on both surfaces as shown, is limited by paralleling full inner turns with approximately half the voltage in the outer, segmented loops. One might choose to call this a ¾-turn coil, as its $f_0 d_c$ product falls about mid-way between that of the E1TI coil of FIG. 3 and its Alderman-Grant half-turn relative, the EHTT coil. However, it may be more important to denote it in a way that shows its distinction among most of the litz coils: its tuning range is severely limited. High $B_1$ homogeneity is achieved only with the proper current ratio for given conductor locations, but the outer loops comprise inductors and capacitors in series, with rapidly changing series impedance compared to the simple inductors for the inner loops. This makes relative currents and hence the $B_1$ homogeneity a sharp function of frequency and severely limits the tuning range. Crossovers could be added to the outer loops for some improvement in $B_1$ homogeneity, but the requirement of precision tuning of capacitor 903 to see the homogeneity improvement makes that complication of questionable value. The $B_1$ homogeneity disadvantage of the EHTF coil is outweighed by its improved $B_0$ homogeneity or ease of manufacturing in some fixed-frequency applications.

The segmenting capacitor 903 is usually selected for quadrupolar electric balance so that the rf voltage at the center of the outer axial loops is zero. The self inductance of the inner and outer loops and their coupling coefficients may be determined using magnetic finite element modeling software, and the required segmenting capacitor may be determined from standard rf circuit modeling software. The coupling coefficient is typically 0.7 for relatively small s, and the effective outer loop inductance that must be negated with capacitor 903 is typically about 60% more than the inductance of an E1T coil of similar size. After considering lead stray capacitance, tuning capacitor 910 is typically comparable to segmenting capacitor 903.

A further manufacturing simplification in which inner litz groups 904, 905 on both surfaces are replaced by a single loop midway between loops 904, 905 having inner subtended angle of typically 60° to 80° would be preferred for cases where the sample diameter is less than 70% to 80% of the coil diameter (depending on s), as adequate homogeneity may then be obtained without an insulated crossover. In this case, the coil has no insulated crossovers and hence is not a litz coil. For very small coils, outer loops 901, 902 may also be replaced by a single loop midway between loops 901, 902 and their symmetric counterparts at typical mean subtended angle of 140° for a further manufacturing simplification. This simple coil still retains the important property of improved transparency to self-generated flux and is a novel design that achieves significantly higher $B_1$ homogeneity, Q, and $\eta_F$ than its closest prior art relative, the segmented parallel single turn saddle resonator (or, in present terminology, parallel half turn Ginsberg coil) of FIG. 7 in U.S. Pat. No. 4,641,098. The basic modification of the prior art is simply the addition of a low-angle unsegmented inner loop in parallel with one of the capacitors on each side and an increase in the subtended angle of the segmented outer loops. It is particularly well suited to $^1$H decoupling in MAS, where mechanical constraints limit the ratio of sample diameter to coil diameter.

Folded, Laser-cut, Litz Foil, Mounted Coils.

The above collection of litz coils fails to address some of those important applications in NMR spectroscopy where background signals from available substrates would defeat the experiment. Polyimides have enormous $^1$H wideline background signals as well as substantial $^{13}$C and some $^{15}$N signals. PTFE-based composites have enormous $^{19}$F, substantial $^{13}$C, and often more $^1$H (from absorbed $H_2O$) than the application permits. The glass fibers that are essential in the composite substrate for control of thermal expansion contain substantial $^{29}$Si, $^{27}$Al, $^{11}$B, $^{19}$F, and usually a host of other problematic contaminates, especially $Fe_2O_3$ and $H_2O$. In situations where the wideline background signals from substrates of available, flexible laminates cannot be tolerated, a solution is to laser-cut a pattern from a non-magnetic metallic sandwich, such as copper-aluminum-copper or copper-rhodium-copper, that can be fabricated into the desired geometry by a sequence of folds and welds. (Electro-chemical etching is often more difficult to control than laser cutting for most magnetically compensated sandwich foils needing fine features.) This cut-and-folded coil or semi-coil may then be affixed to a suitable cylindrical coilform, such as quartz, alumina, forsterite ($2MgO \cdot SiO_2$), or silicon nitride, with a carefully formulated adhesive, such as deuterated, $^{13}$C-depleted epoxy, magnetically compensated with a paramagnetic compound such as CuO, according to the prior art.

Prior art mounted foil coil designs have tried to minimize the number of crossovers because of the difficulties involved in providing non-magnetic or background-free insulation at the crossovers. Hence, prior art compensated wire and foil NMR coils of the mounted-coil type have used a single, spiral path for each semi-coil with a single, series, lead crossover per side, usually with air gap rather than solid dielectric spacer at the lead crossover. However, the dielectric insulator need not be non-magnetic if it has a precisely uniform cross-section, extends well beyond the sample region, and is precisely aligned with the external magnetic field, as its magnetic perturbations are then localized near its ends. Hence, long, axially aligned uniform strips of vacuum-baked PTFE, polyimides, or ceramics may be-used as suitable insulators at the crossovers in these applications. The extra radial space required for the folded and mounted coils generally makes them a poor choice for most quadrature and MRI applications.

Figure 10A:
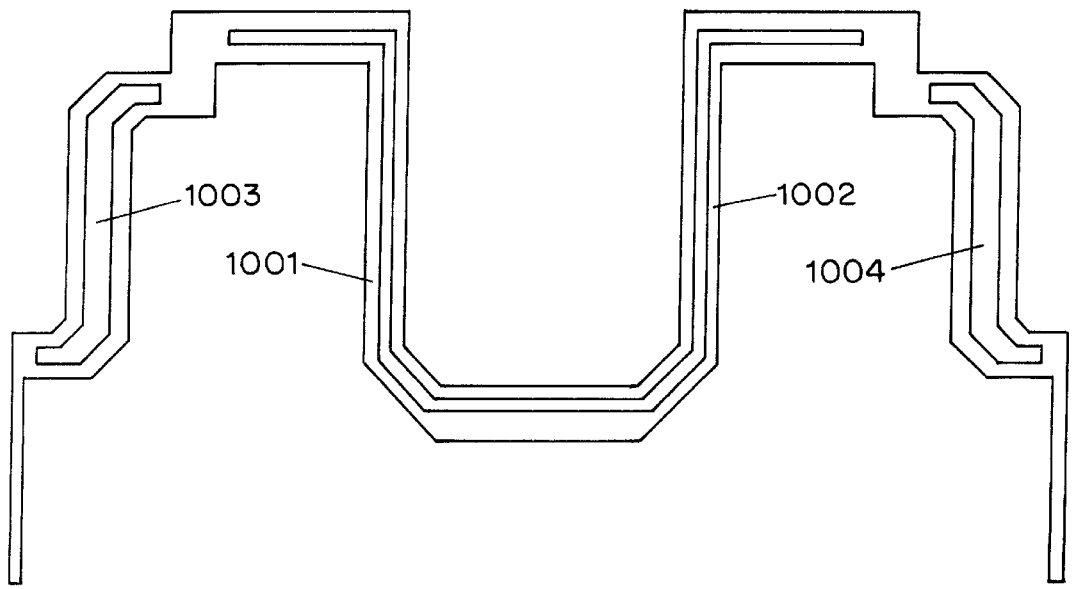
FIGS. 10a, 10b, and 10c disclose the laser-cut folded-2-turn (F2T) litz foil semi-coil.
Figure 10B:
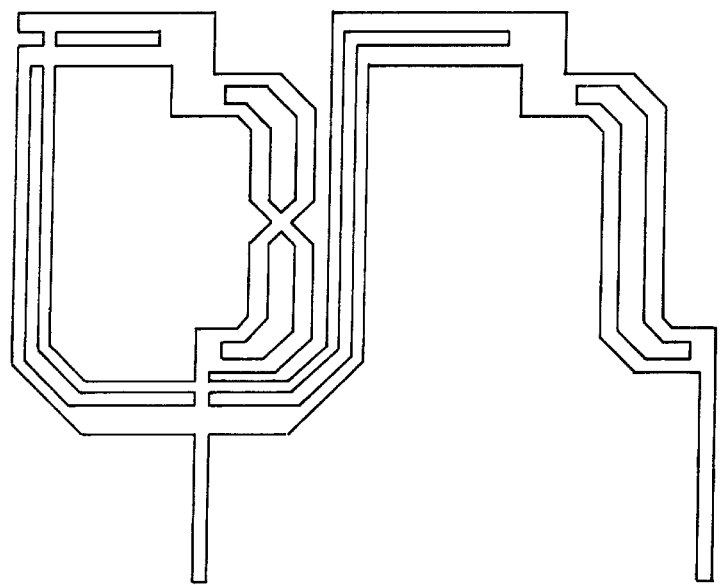
Figure 10C:
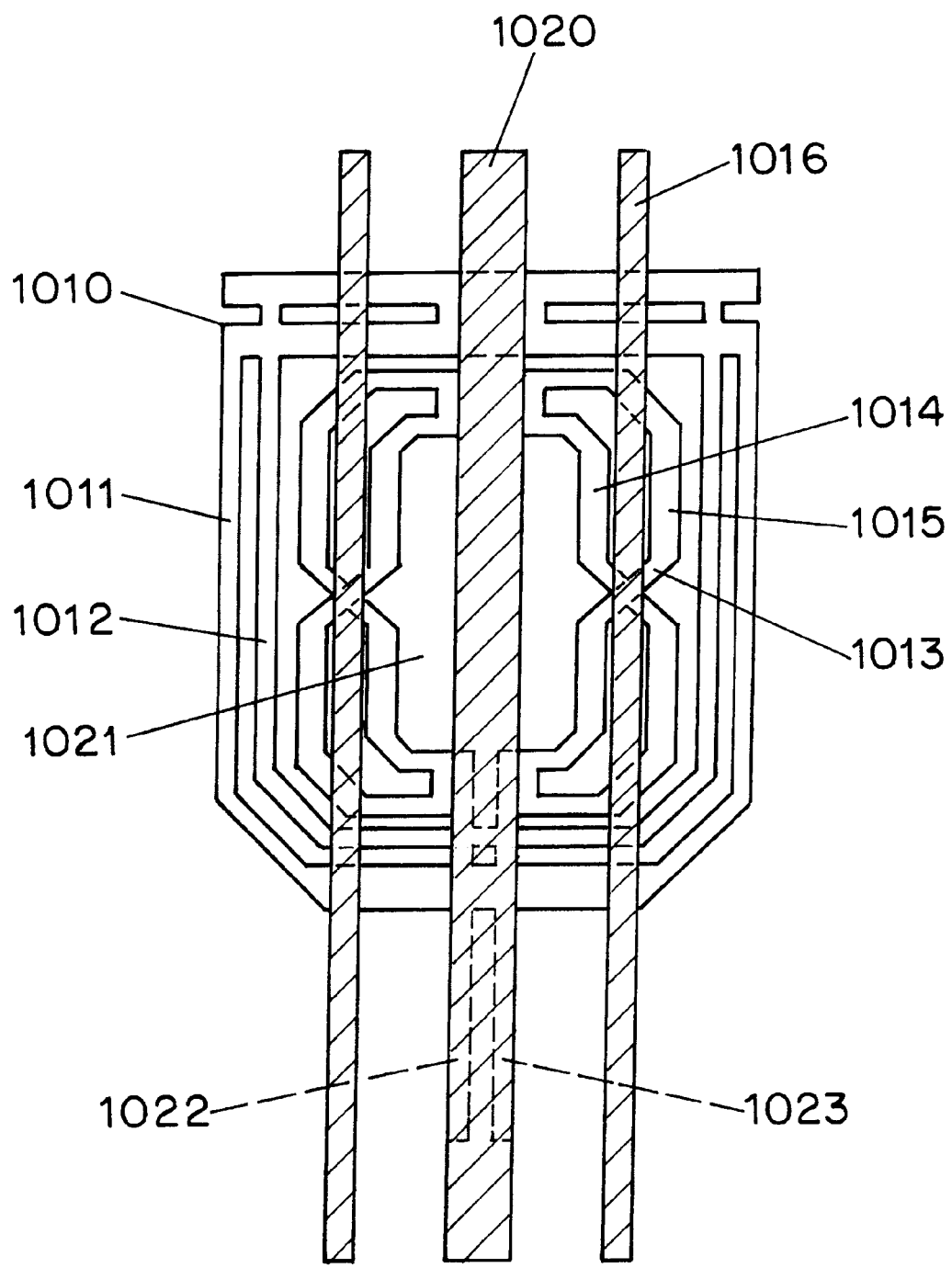

FIG. 10*a* discloses the Folded-2-Turn (F2T) litz foil semi-coil as it appears when laser-cut from a non-magnetic foil sandwich prior to folding. After a 180-fold along fold line 1001, and a 180 twist about axis, the foil appears as shown in FIG. 10*b*. The fold produces litz crossover 1010 in the outer loops 1011, 1012 which would normally be insulated only by an air gap. The twist produces litz crossover 1013 in inner loops 1014, 1015 which may be insulated by long dielectric strip 1016 or an air gap. The second fold at fold line 1002 and twist at twist line 1004 complete the semi-coil as shown in FIG. 10*c*. A central dielectric strip 1020 along the center of the central flux window 1021 is required to insulate the leads 1022, 1023 from the outer loops and to insulate the upper turn crossover (this is not a litz crossover). Note that the F2T coil is essentially equivalent to the E2TI coil of FIG. 7 except that the outer loops in the F2T coil are not as symmetrically divided. Hence, the current in the outer loops of the F2T coil is not as equally divided, but the effects of unequal currents in the outer loops on σ, Q, ε, and $\eta_F$ are marginal when the loops are properly located.

As with the etched coils, cylindrical shields extending under the outermost arcs are sometimes desired. Hence, the completed coil comprises non-magnetic foil sandwich shields affixed to the inside of a cylindrical coilform with two semi-coils as shown in FIG. 10*c* suitably affixed to the outside of the cylinder. With shields, the total inductance L (in nH) of the F2T litz coil of diameter $d_c$ (in mm), external shield diameter $sd_c$, and central flux window length $h_1$, is given by:

$$L \cong 6d_C \frac{(s-0.95)}{s} \left(\frac{h_1}{d_C}\right)^{0.6}$$

and thus satisfies the inequality:

$$L < 7d_C \frac{(s-0.95)}{s} \left(\frac{h_1}{d_C}\right)^{0.6}$$

When more inductance is needed to improve multi-nuclear performance on small samples at low frequencies, two identical multi-turn litz semi-coils (E3T, E2T, F2T) may be connected in series, as has been the custom with conventional coil designs. The series-connected E2T coil is denoted the E4T coil, and the series connected E3T coil is denoted the E6T coil. For sample diameters below 2.5 mm, etched 8-turn Zens saddle coils, with modern numerical optimization, may be selected.

Figure 11A:
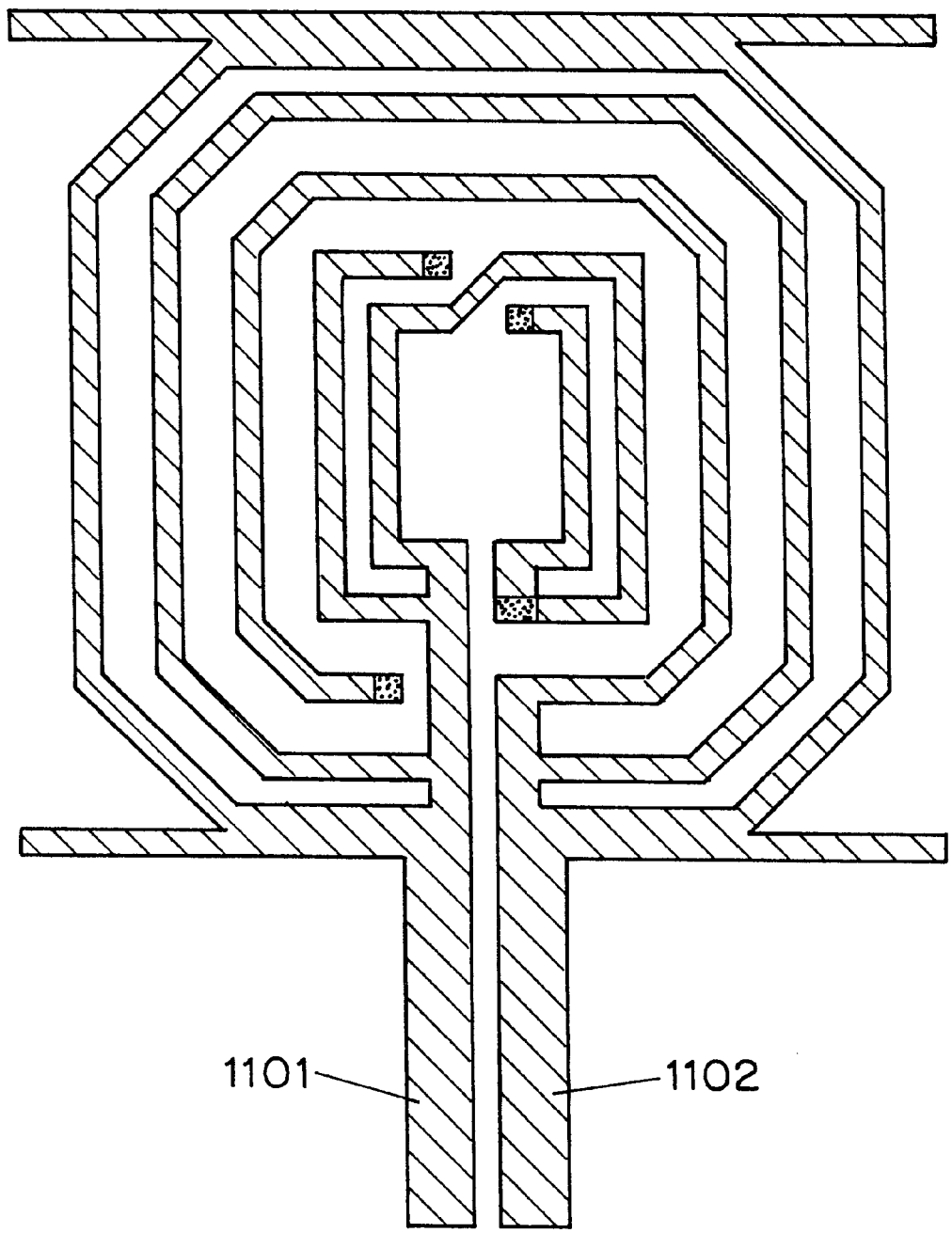
FIGS. 11a and 11b illustrate the cut-1-turn (C1T) litz foil semi-coil.
Figure 11B:
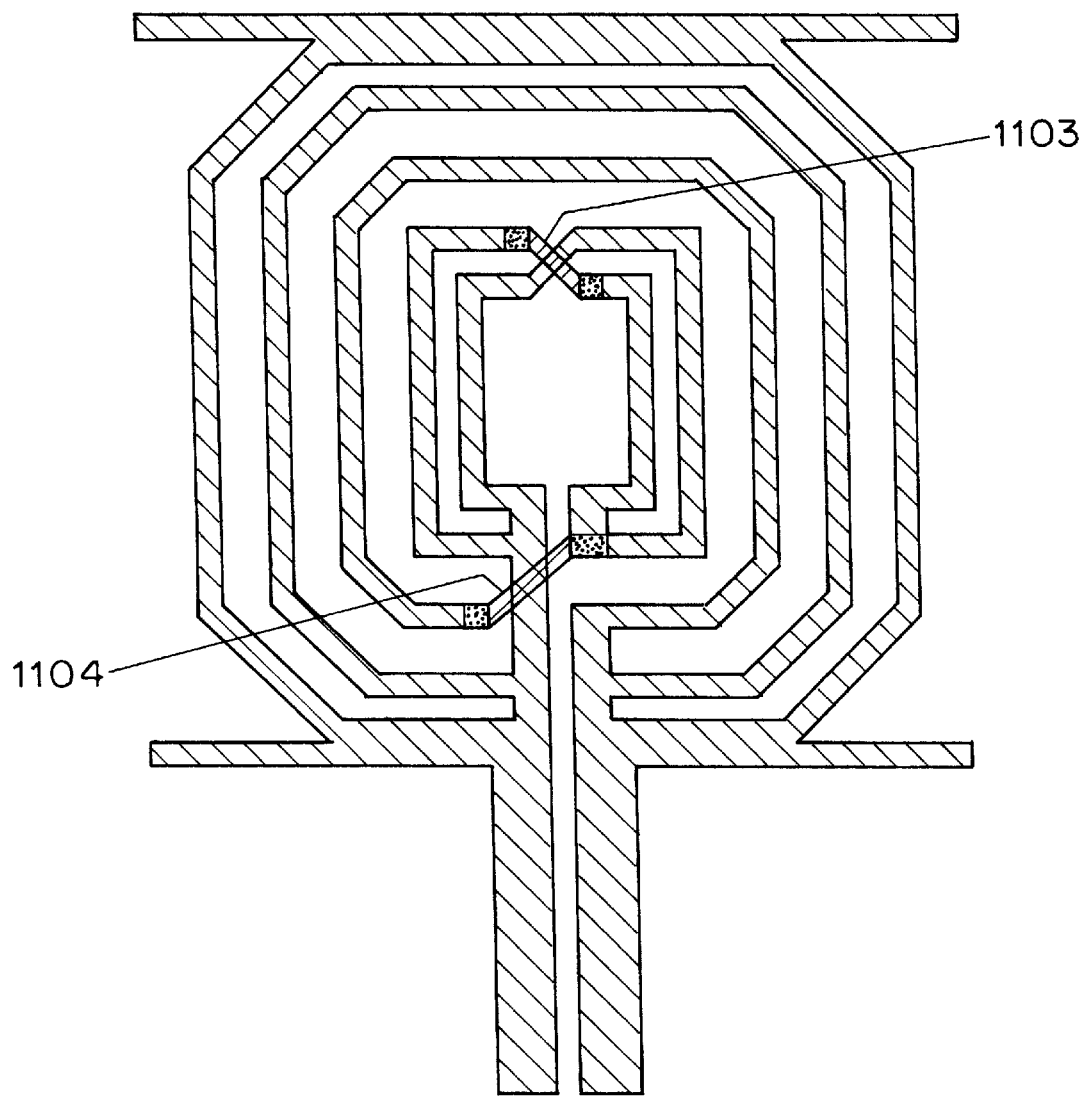

For high frequencies or large samples where backgrounds are critical, FIG. 11*a* discloses the Cut-1-Turn (C1T) litz foil semi-coil as it appears when laser-cut from a non-magnetic foil sandwich. It is similar to one surface of the E1T coil, FIG. 8b, with leads 1101, 1102. No folds are required, but two non-magnetic jumpers 1103, 1104 must be welded as shown in FIG. 11b to complete the inner litz group and litz super-group. Again, it would be mounted and shielded as was the F2T coil, for example.

Figure 12A:
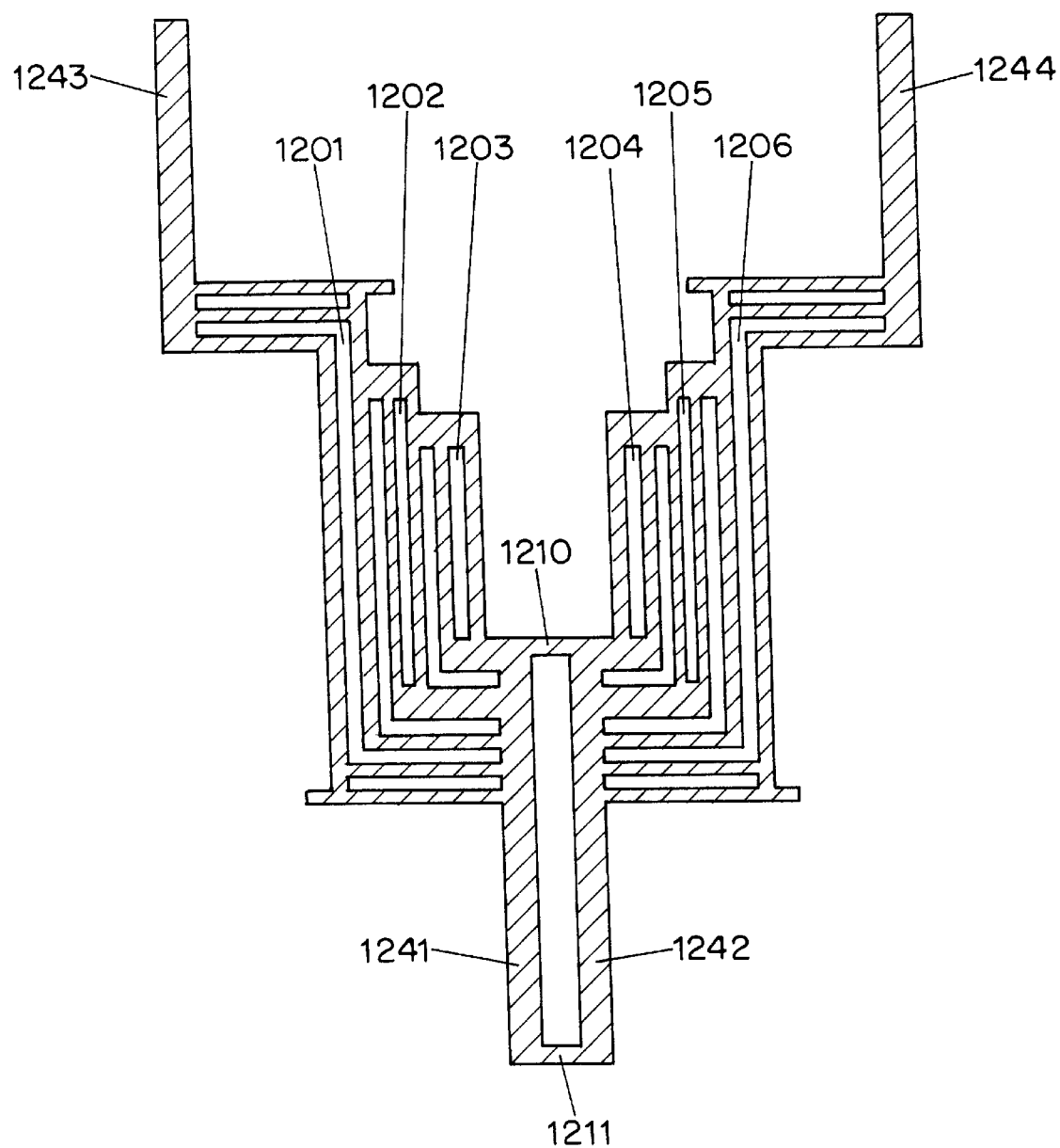
FIGS. 12a, 12b, and 12c disclose the folded-half-turn-fixed-frequency (FHTF) litz foil semi-coil.
Figure 12B:
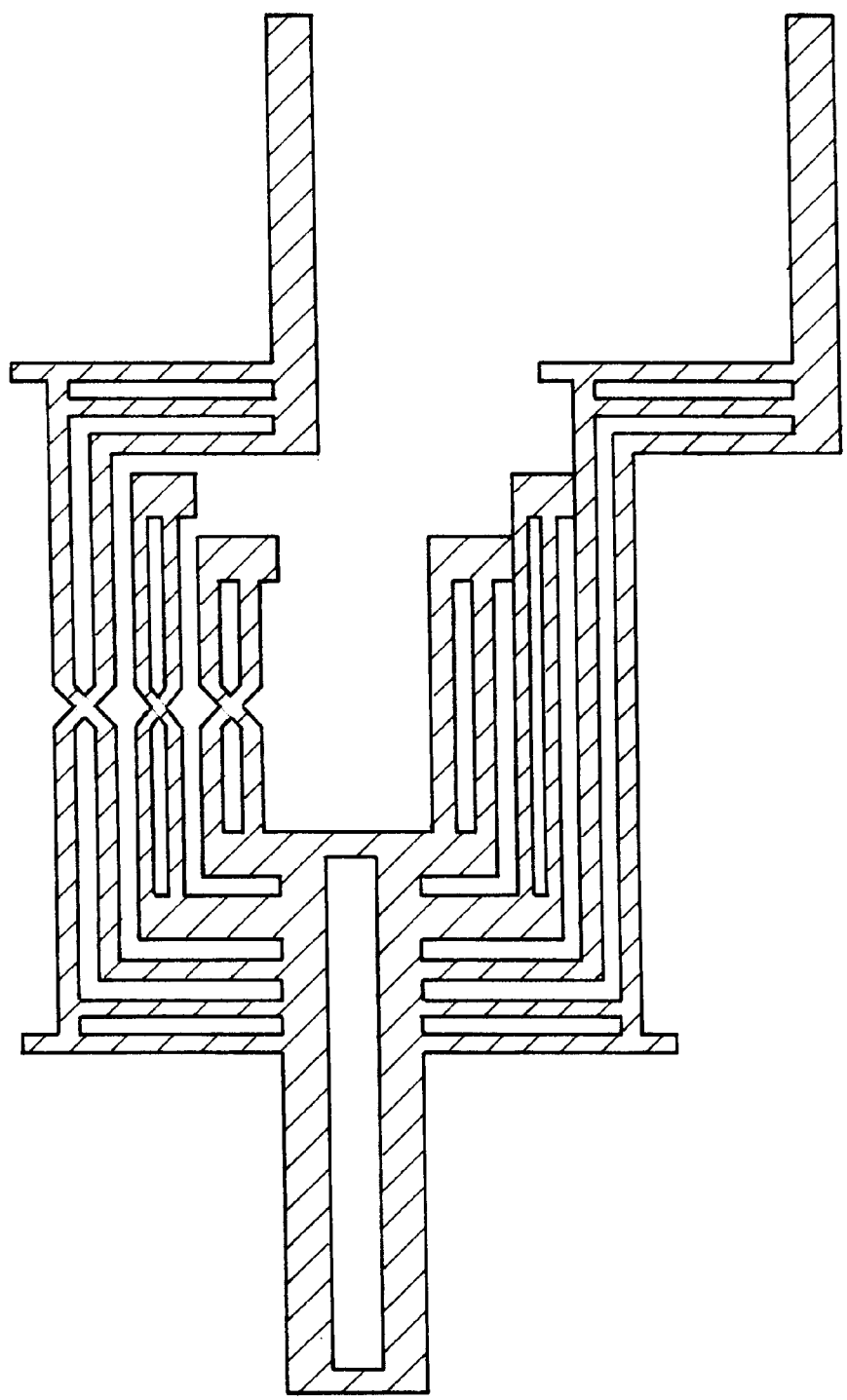
Figure 12C:
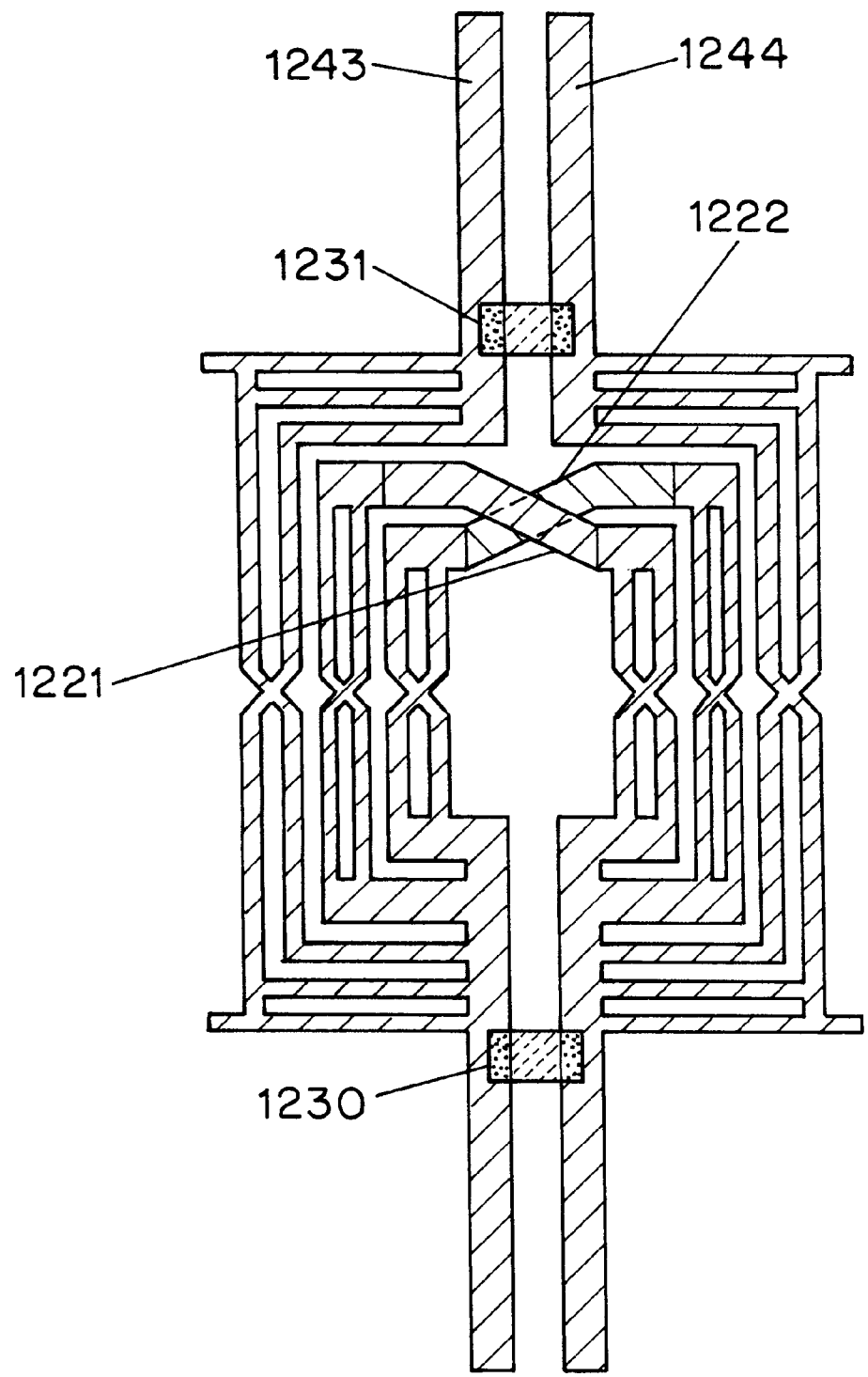

For the highest frequencies or largest samples where backgrounds are critical, FIGS. 12a, 12b, and 12c disclose the Folded-Half-Turn-Fixed (FHTF) litz foil semi-coil, similar to the EHTF semi-coil of FIG. 9. Again, FIG. 12a shows the initial, unfolded geometry, as laser-cut from non-magnetic foil sandwich, with twist axes 1201, 1202, 1203, 1204, 1205, 1206. FIG. 12b shows the appearance after performing the three 180-twists in the first quadrant. Construction straps 1210, 1211 serve only to maintain alignment and must be removed (typically using a ceramic knife) after the coil is mounted on the coilform. Crossovers 1221, 1222 must be welded in place as shown in FIG. 12c. Insulating dielectric strips as used in the F2T coil are normally not required, as the mounted foil will adequately maintain the required air gaps at the crossovers. FIG. 12c shows the final appearance of the FHTF semi-coil with segmenting/tuning capacitors 1230, 1231 mounted on leads 1241, 1242, 1243, 1244.

Proof Spectra.

The array of NMR spectra of variable pulse widths in FIG. 13 demonstrates the high $B_1$ homogeneity made possible by the litz coil. The single-pulse, proton Bloch decay NMR spectra are arrayed as the rf pulse width is increased in 9 $\mu$s increments from 9 $\mu$s through over 500 $\mu$s with 5-s recycle delays between pulses. The spectra were acquired on a 36-mm diameter sample of water, 25-mm in length, inside a 41-mm diameter EHTT coil with $h_1$=27 mm and a 50-mm external rf shield diameter at 7.06 T. Note that the amplitude of the 4.5-$\pi$ pulse is over 60% of the amplitude of the $\pi/2$ pulse, and phase dispersion is still negligible for the 6.5-$\pi$.

Figure 14A:
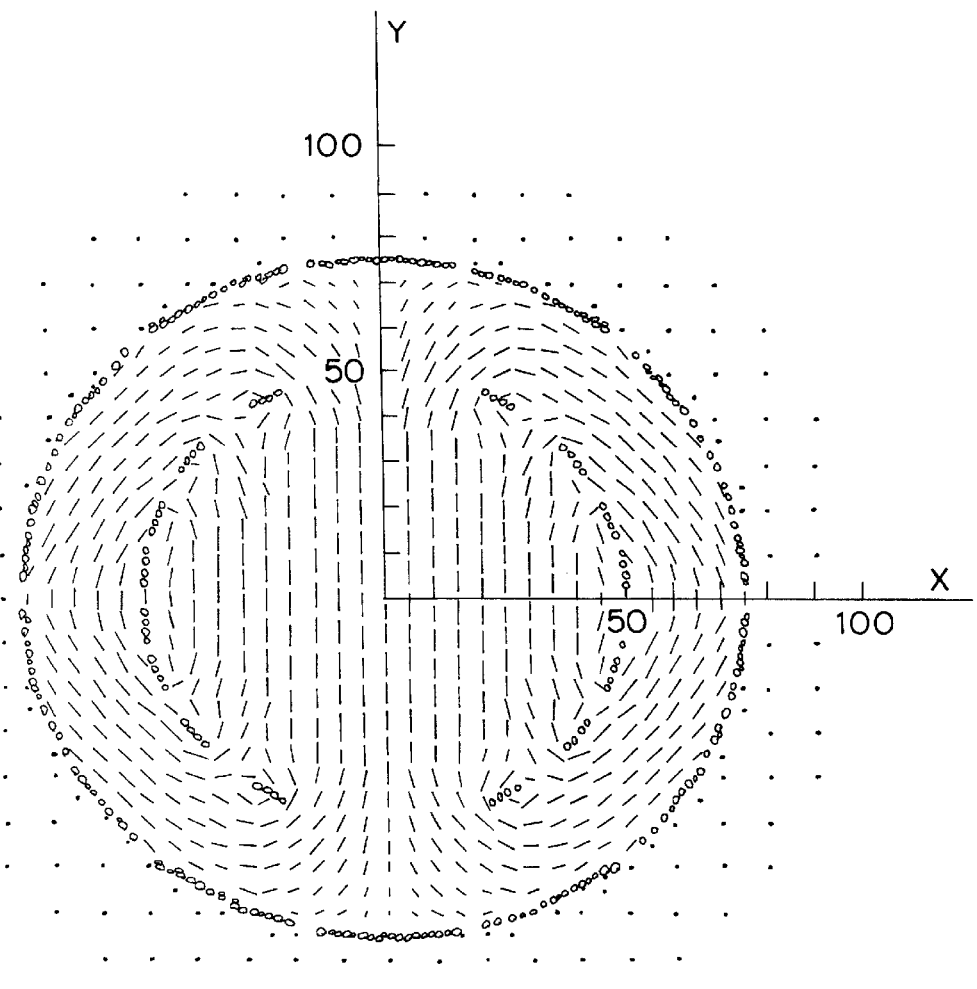
FIGS. 14a and 14b illustrate the field vectors for a typical EHTT coil in an XY and YZ plane respectively.
Figure 14B:
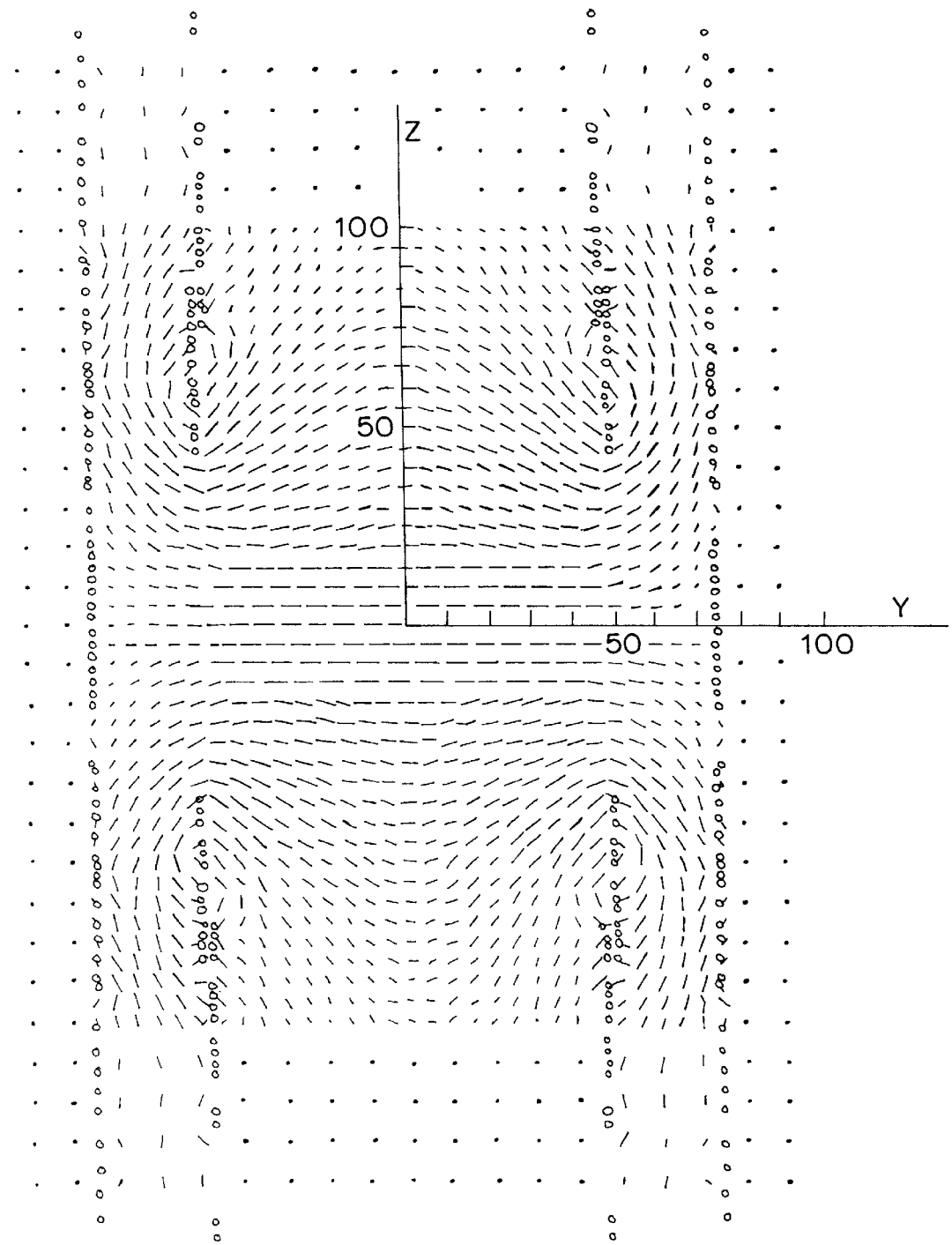

FIG. 14a illustrates the magnetic field vector projections for a 100-mm EHTT coil in the XY plane for z=$h_1$/3, as calculated by finite element analysis. FIG. 14b illustrates the magnetic field vector projections in the YZ plane for x=d/10. The litz coil conductor sections are represented by the closely spaced small circles at a radius of 50 mm. The external shield has a radius of 75 mm, where induced current elements are represented by small circles. The internal cylindrical rf shield has a radius of 48 mm with a similar representation in FIG. 14b. In both cases, the vectors are represented by directed segments of length proportional to the square root of the projected magnitude for greater visibility in the low-field regions near the ends and outside. Note that a coarser element grid is used for z greater than 100 and r greater than 75. Note that the flux through the central flux window is a minor fraction of the total flux.

Butterfly Litz Coils for High Field Spectroscopy.

While the above litz coil geometries may be used with small samples, additional manufacturing simplifications are beneficial for the smallest samples (below 8 mm), as the crossovers take up precious radial space and introduce magnetic perturbations. Also, it is often easier to reduce coupling between orthogonal coils when the leads are brought out 90° with respect to the $B_1$ axis. The family of etched butterfly litz volume coils, described below, is better suited to small samples, but it is also sometimes preferred for large samples, especially in multinuclear double-resonance applications.

Figure 15A:
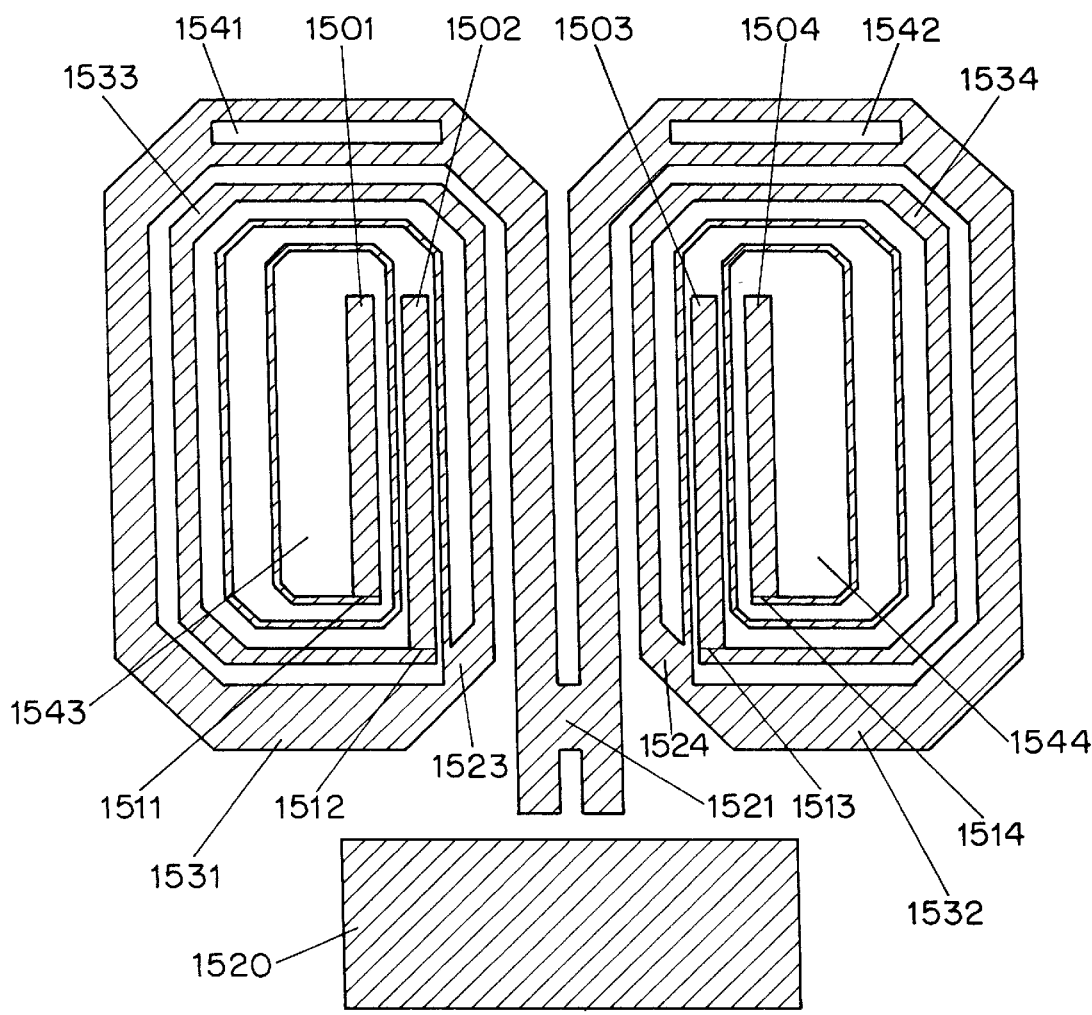
FIGS. 15a and 15b illustrate the etched-2-turn butterfly litz (E2TB) coil.
Figure 15B:
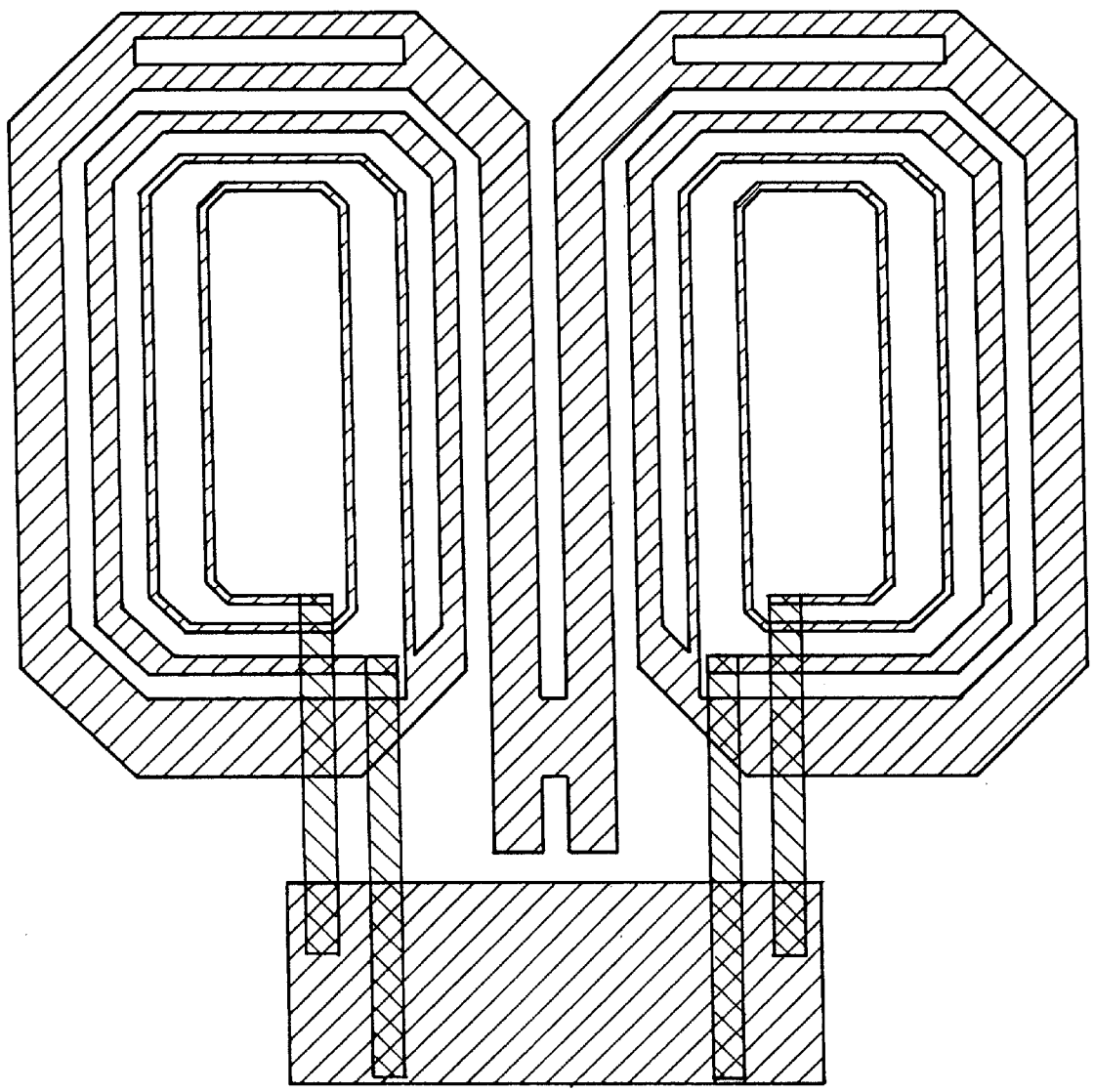

For high-resolution NMR on small samples at high frequencies, the etched-2-turn butterfly (E2TB) litz semi-coil shown in FIGS. 15a and 15b is better suited and is likely to be one of the most popular NMR spectroscopy coils. FIG. 15a illustrates a typical etch pattern for one side. To minimize the magnetic compensation difficulties associated with feedthroughs, soldering, or welding near the center of the coil, the pattern first is etched and plated for magnetic compensation. The plus-phase leads 1501, 1502, 1503, 1504 are then peeled off the substrate back to the fold lines 1511, 1512, 1513, 1514 and arched over the arcuate members 1531, 1532 to the plus-phase bus node 1520. A jumper is required from the negative-phase bus 1521 over bus 1520. As in the previous E2T coil, this results in litz groups only on the inner turns, between nodes 1520 and 1523 or 1524. The full current on each side executes one turn 1531, 1532 before splitting. About two-thirds of the current on each side executes the middle turn 1533, 1534, returning to bus 1520 via leads 1502, 1503, and about one-third of the current executes the inner two turns around central flux windows 1543, 1544, returning to bus 1520 via leads 1501, 1504.

Contrary to the design of the previous litz coils, the inner two series loops in the E2TB coil link about twice the flux of the middle loop with which they are paralleled. However, they are bisected by a plane containing the $B_1$ axis and the axis of the coilform. Hence, the symmetry still leaves this litz group transparent to orthogonal fields and having optimum transparency to self-generated fields for best homogeneity and filling factor. As with previous litz coils, internal cylindrical rf shields are often desired at each end. Windows 1541, 1542 may be cut in the arcs and bands of the outer turn to reduce stray capacitance.

Note that the prior art includes similar butterfly coils with simple (non-litz) spirals for each semi-coil. Insulated crossovers were required to make connection to the window lead of each semi-coil, but the semi-coils of the prior-art do not separately contain parallel paths with insulated crossovers.

Figure 16A:
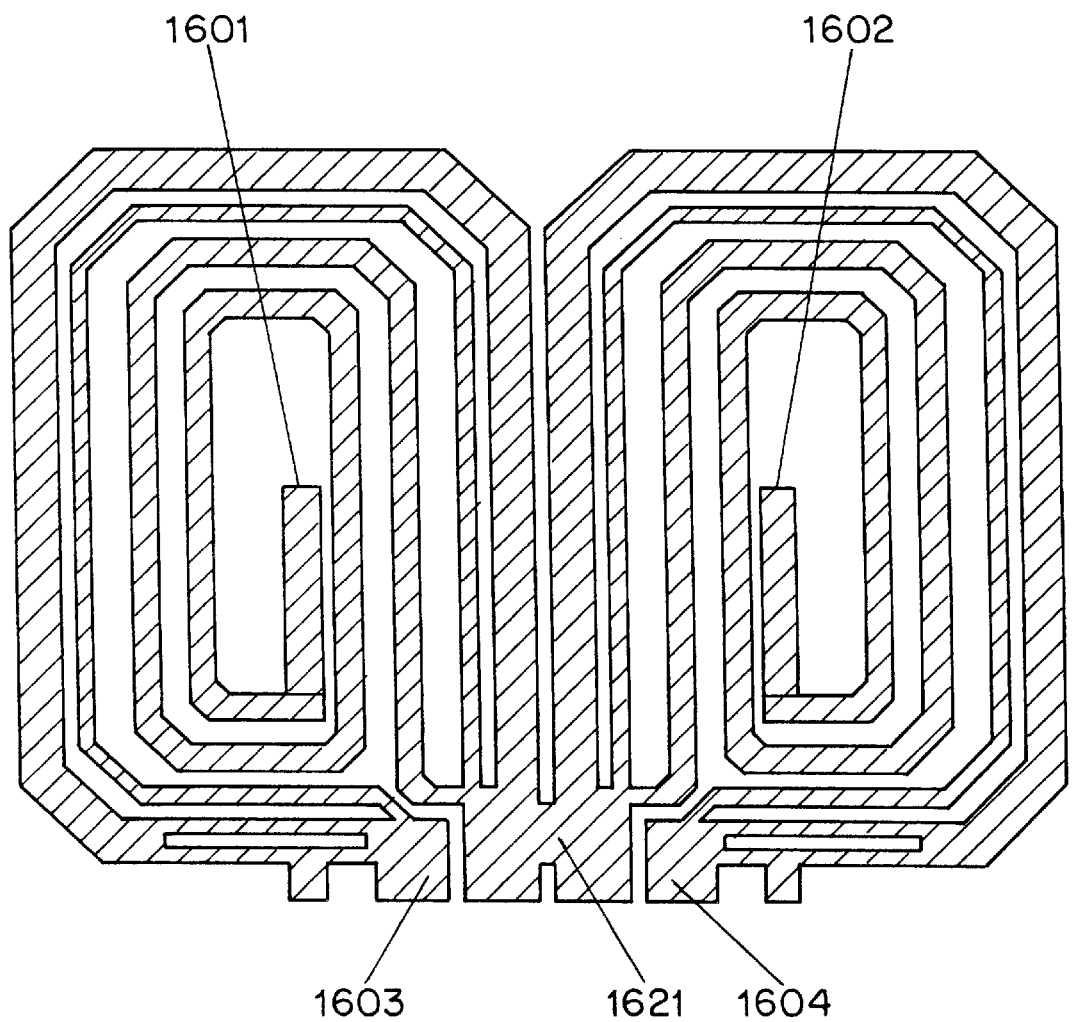
FIGS. 16a and 16b illustrate the etched-1-turn butterfly litz (E1TB) coil.
Figure 16B:
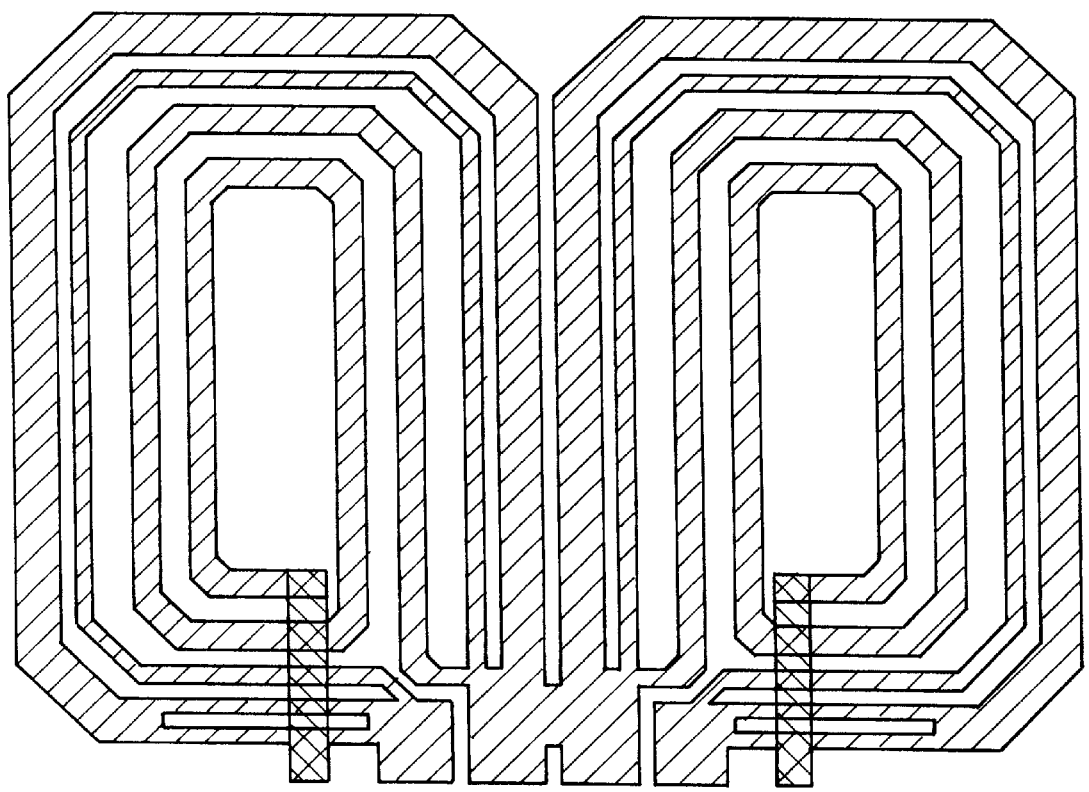

For high-resolution NMR on somewhat larger samples or at higher frequencies, the etched-1-turn butterfly (E1TB) litz semi-coil shown in FIGS. 16a and 16b is often the best choice. FIG. 16a illustrates a typical etch pattern for one side. Again, the leads 1601, 1602 to the inner turns are pealed back, arched over the mid turns, and paralleled with the outer turns at tabs near nodes 1603, 1604, which are then connected by a jumper over bus 1621. Again, this litz coil is transparent to orthogonal fields by virtue of its symmetry, even though the sub-routes in the litz groups link substantially differing flux.

Table 1 below summarizes the applications of the above litz foil coils in order of descending $f_0d_c$. The first column lists the type designation. The second column indicates a figure (or related figure) reference number. The third column gives a maximum practical frequency-diameter product (MHz-m) for a short coil with shield diameter of 1.4 $d_c$. The fourth column indicates a minimum practical coil diameter. The final four columns indicate whether or not the design is well suited for conventional double-tuning, multi-nuclear (greater than 5% tuning range), high resolution, and MRI.

| Type | Figure No. | Max. $f_0d_c$ (MHz-m) | Min. $d_c$ (mm) | DT | M-X | HR | MRI |
| --- | --- | --- | --- | --- | --- | --- | --- |
| EQTI | 3 (4) | 40.00 | 16.00 | N | N | N | Y |
| EHTT | 3 (14) | 30.00 | 7.00 | N | Y | N | Y |
| EHTF | 9 | 20.00 | 4.00 | N | N | Y | N |
| FHTF | 12 | 20.00 | 10.00 | N | N | Y | N |
| E1TI | 3 | 18.00 | 7.00 | Y | Y | N | Y |
| E1TB | 16 | 16.00 | 3.00 | Y | Y | Y | Y |

-continued

| Type | Figure No. | Max. $f_o d_c$ (MHz-m) | Min. $d_c$ (mm) | DT | M-X | HR | MRI |
|---|---|---|---|---|---|---|---|
| E1T | 8 | 16.00 | 5.00 | Y | Y | Y | Y |
| C1T | 11 | 14.00 | 6.00 | Y | Y | Y | N |
| E2T | 6 | 10.00 | 5.00 | Y | Y | Y | Y |
| E2TI | 7 | 9.00 | 6.00 | Y | Y | Y | Y |
| F2T | 10 | 9.00 | 9.00 | Y | Y | Y | N |
| E2TB | 15 | 9.00 | 3.00 | Y | Y | Y | Y |
| E3T | 5 | 7.00 | 3.00 | Y | Y | Y | Y |
| E4T | 6 | 6.00 | 3.00 | Y | Y | Y | N |
| E6T | 5 | 4.00 | 3.00 | Y | Y | Y | N |

I claim:

1. A litz coil formed on the surface of a substantially elliptical coilform for use in a main polarizing magnetic field $B_Z$ for magnetic resonance for the purpose of generating or detecting rf $B_1$ transverse to the axis of said coilform in, for example, the y-direction inside an external rf shield, said litz coil comprising:
 a litz group comprising multiple, parallel, conductor foils having interwoven sub-routes from a first node to a second node and insulated crossovers such that at least two well-defined flux sub-windows are formed,
 a first litz semi-coil on the +y side of said coilform comprising at least one litz group and a series-parallel combination of conductors forming axial and azimuthal conductor elements around a central flux window centered on the +y axis,
 a second substantially equivalent litz semi-coil on the −y side of said coilform with electrical coupling means to said first litz semi-coil,
 said first litz semi-coil further characterized as having leads for connecting to a tuning capacitor,
 said sub-routes positioned such that when said litz coil is driven by rf current at a predetermined frequency the total rf magnetic flux through said central flux window is less than 50% of the total rf magnetic flux through the y=0 plane.

2. The litz coil of claim 1 wherein said conductors comprise foil patterns that have been etched on the surfaces of double-clad laminate and said crossovers are connected by feedthroughs between the surfaces of said laminate, said laminate comprising copper cladding over a flexible substrate having low dielectric loss.

3. The litz coil of claim 1 wherein: said first litz semi-coil comprises 4n litz groups, said litz semi-coil is substantially symmetric with respect to reflections through to two perpendicular planes, and n is a positive integer.

4. The litz coil of claim 1 wherein said flux sub-windows within said litz group have approximately equal areas.

5. The litz coil of claim 1 wherein said flux sub-windows within said litz group are substantially bisected by a plane containing the center of said central flux window and said axis of said coilform.

6. The litz coil of claim 1 wherein said central flux window subtends azimuthal angle less than 85°.

7. The litz coil of claim 1 wherein the outermost edges of said axial conductor elements subtend azimuthal angle greater than 160°.

8. The litz coil of claim 1 wherein said substantially elliptical coilform is flexible.

9. The litz coil of claim 1 wherein said elliptical coilform is cylindrical.

10. The litz coil of claim 1 wherein said axis of said coilform is parallel to $B_Z$.

11. The litz coil of claim 1 wherein said axis of said coilform is inclined at 54.7° with respect to $B_Z$.

12. The litz coil of claim 1 wherein the outermost of said azimuthal conductor elements are shielded from the sample by an internal cylindrical rf shield.

13. The litz coil of claim 1 wherein the leads to said tuning capacitor are shielded from the sample.

14. The litz coil of claim 1 wherein said conductor elements execute one turn around said central flux window and a first segmenting capacitor is inserted into a node opposite said tuning capacitor between two series-connected conductor groups of substantially equal inductance, said tuning capacitor and said segmenting capacitor having comparable values.

15. The litz coil of claim 2 wherein said feedthroughs comprise copper foil through slits in said substrate.

16. The litz coil of claim 2 wherein said foil patterns are plated first with a paramagnetic metal and then with a diamagnetic metal such that the magnitude of the total magnetization of the pattern is substantially reduced.

17. The litz coil of claim 2 wherein most of the conductor elements adjacent to said central flux window on the first surface of said laminate are duplicated on the second surface of said laminate and paralleled by suitable feedthroughs.

18. The litz coil of claim 1 further characterized in that the inside edge of a conductor foil has been extended radially outward from said coilform by bending or rolling, where the inside edge is defined as the edge closer to said central flux window.

19. The litz coil of claim 1 wherein said conductor foils have been cut from a multi-layer metallic foil sandwich having magnitude of bulk magnetic susceptibility less than 25% that of pure copper.

20. The litz coil of claim 9 wherein said coilform is made from forsterite.

21. The litz coil of claim 19 wherein said crossovers are insulated with axially aligned, homogeneous, dielectric strips of uniform cross-section and length greater than the sum of the length of said central flux window and the radius of said coilform.

22. The litz coil of claim 2 wherein said litz semi-coil is further characterized as including a litz super-group, said litz super-group comprising a low-inductance litz group in series with a higher inductance conductor group, said litz super-group connected in parallel with a third inductor group.

23. The litz coil of claim 22 wherein said higher inductance conductor group is a litz group.

24. The litz coil of claim 22 wherein said third inductor group is a second litz super-group symmetrically related to said first litz super-group.

25. The litz coil of claim 22 wherein a second segmenting capacitor is inserted between said low-inductance litz group and said higher-inductance conductor group.

26. The litz coil of claim 25 wherein a third segmenting capacitor is inserted into a node in said higher-inductance conductor group.

27. The litz coil of claim 24 wherein the outermost edges of said axial conductor elements subtend azimuthal angle of approximately 174°, the central flux window subtends azimuthal angle of approximately 56°, and the diameter of said external rf shield is approximately 1.2 times the mean diameter of said coilform.

28. The litz coil of claim 25 wherein said electrical coupling means comprise tabs near the axial center and at azimuthal location perpendicular to said y axis.

29. The litz coil of claim 1 wherein one of said sub-routes is broken by an audio blocking capacitor, where said audio blocking capacitor has magnitude of reactance $X_C$ that is much less than the reactance $X_L$ of the self inductance of said litz group at the lowest rf frequency of intended use.

30. The litz coil of claim 1 wherein each of said sub-routes is broken by an audio blocking capacitor, where each said blocking capacitor has equal value and each has magnitude of reactance $X_C$ that is less than the reactance $X_L$ of the self inductance of said litz group at the lowest rf frequency of intended use.

31. A litz coil for use in an external polarizing magnetic field $B_Z$ for magnetic resonance for the purpose of generating or detecting rf $B_1$ transverse to the axis of a sample in, for example, the y-direction, said litz coil comprising:

a litz group comprising multiple, parallel, conductors having interwoven sub-routes from a first node to a second node and insulated crossovers such that at least two well-defined flux sub-windows are formed, a first litz semi-coil on the +y side of said sample comprising at least one litz group and a series-parallel combination of conductors forming axial and azimuthal conductor elements around a central flux window centered on the +y axis, a second litz semi-coil on the −y side of said sample with coupling means to said first litz semi-coil, said first litz semi-coil further characterized as having leads for connecting to a tuning capacitor, said sub-routes positioned such that when said litz coil is driven by rf current at a predetermined frequency the total rf magnetic flux through said central flux window is less than 80% of the total rf magnetic flux through the y=0 plane.

32. A litz coil for magnetic resonance formed on the surface of a coilform of mean diameter $d_C$ inside an external rf shield of mean diameter $sd_C$ for the purpose of generating or detecting a transverse rf $B_1$, said coil comprising:

multiple, parallel, interwoven, axial and azimuthal conductor elements circumscribing central flux windows of axial length $h_1$ on opposite sides of said coilform, low-inductance leads for connecting said coil to capacitive tuning means, current paths such that when rf current is applied to said leads at resonance the current in conductor elements adjacent to one of said central flux windows is less than 35% of the sum of the current in all axial elements in one quadrant of said coil and the net flux between adjacent said conductor elements is greater than the 70% of the flux through one of said central flux windows, effective parallel coil inductance L that satisfies the following over a wide range of frequencies:

$$L < 7d_C \frac{(s-0.95)}{s}\left(\frac{hl}{d_C}\right)^{0.6}$$

where the coefficient has units of nH/mm.

33. A half-turn-fixed-frequency (HTF) rf coil for NMR formed on the surface of an elliptical coilform, said rf coil comprising a first HTF semi-coil on, for example, the +y side of said coilform and a second substantially equivalent HTF semi-coil on the −y side of said coilform with electrical coupling means to said first HTF semi-coil, said first HTF semi-coil comprising, a segmented outer saddle loop executing one turn around said +y axis, said outer loop subtending mean azimuthal angle greater than 125° but less than 155°, segmenting capacitors at opposite axial ends of said outer loop, an unsegmented inner loop executing one turn around a central flux window centered on said +y axis and subtending azimuthal angle greater than 50° but less than 80°, said inner loop connected in parallel with one of said segmenting capacitors.

34. A quadrature litz coil approximately aligned with the main polarizing magnetic field $B_Z$ for magnetic resonance for the purpose of generating or detecting a rotating transverse rf $B_1$ inside an external cylindrical rf shield, said quadrature litz coil comprising two concentric litz coils of slightly differing diameters rotated 90° with respect to the other, each said litz coil tuned to resonate at the same frequency and each comprising:

a litz group comprising multiple, parallel, conductors having interwoven sub-routes from a first node to a second node and insulated crossovers such that at least two well-defined litz flux sub-windows are formed, a first litz semi-coil on, for example, the +y side of said coilform comprising at least one litz group and a series-parallel combination of conductors forming axial and azimuthal conductor elements around a central flux window centered on the +y axis, a second substantially equivalent litz semi-coil on the −y side of said coilform with electrical coupling means to said first litz semi-coil, said first litz semi-coil further characterized as having leads for connecting to a tuning capacitor, said sub-routes positioned such that when said litz coil is driven by rf current at a predetermined frequency the total rf magnetic flux through said central flux window is less than 50% of the total rf magnetic flux through the y=0 plane.

35. A quadrature litz birdcage coil approximately aligned with the main polarizing magnetic field $B_Z$ for magnetic resonance for the purpose of generating or detecting a rotating transverse rf $B_1$ inside an external cylindrical rf shield, said quadrature litz birdcage coil comprising a conventional MRI birdcage coil in which a plurality of conductor elements have been replaced by litz groups, where a litz group comprises multiple, parallel, conductor foils having interwoven sub-routes from a first node to a second node and insulated crossovers such that at least two well-defined flux sub-windows are formed.

36. A quadrature litz birdcage coil approximately aligned with the main polarizing magnetic field $B_Z$ for magnetic resonance for the purpose of generating or detecting a rotating transverse rf $B_1$ inside an external cylindrical rf shield, said quadrature litz birdcage coil comprising a conventional MRI birdcage coil in which a plurality of conductor elements have been replaced with conventional litz wire.

37. The quadrature litz birdcage coil of 36 wherein said litz wire is loosely woven and spread out to cover a greater portion of the surface area of said coil.

* * * * *